US012209987B2

(12) United States Patent
Hsiao et al.

(10) Patent No.: US 12,209,987 B2
(45) Date of Patent: Jan. 28, 2025

(54) SEMICONDUCTOR BIOSENSOR

(71) Applicant: TAIWAN SEMICONDUCTOR MANUFACTURING COMPANY LTD., Hsinchu (TW)

(72) Inventors: Yi-Hsing Hsiao, Hsinchu (TW); Jui-Cheng Huang, Hsinchu (TW); Yu-Jie Huang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 240 days.

(21) Appl. No.: 17/818,175

(22) Filed: Aug. 8, 2022

(65) Prior Publication Data

US 2022/0390412 A1 Dec. 8, 2022

Related U.S. Application Data

(62) Division of application No. 16/851,008, filed on Apr. 16, 2020, now Pat. No. 11,668,671.

(51) Int. Cl.
| | |
|---|---|
| *H01L 29/66* | (2006.01) |
| *G01N 27/414* | (2006.01) |
| *H01L 29/08* | (2006.01) |
| *H01L 29/417* | (2006.01) |
| *H01L 29/786* | (2006.01) |

(52) U.S. Cl.
CPC ..... *G01N 27/4145* (2013.01); *H01L 29/0847* (2013.01); *H01L 29/41733* (2013.01); *H01L 29/66742* (2013.01); *H01L 29/786* (2013.01)

(58) Field of Classification Search
None
See application file for complete search history.

(56) References Cited

U.S. PATENT DOCUMENTS

2019/0033252 A1   1/2019   Huang et al.

*Primary Examiner* — Joseph C. Nicely
*Assistant Examiner* — Lamont B Koo
(74) *Attorney, Agent, or Firm* — WPAT LAW; Anthony King

(57) ABSTRACT

A biosensor includes a semiconductor layer having a first surface and a second surface opposite to the first surface, a FET device in the semiconductor layer, an isolation layer over the first surface of the semiconductor layer, a dielectric layer over the isolation layer and the first surface of the semiconductor layer, and a pair of first electrodes and a pair of second electrodes over the dielectric layer and separated from each other. The isolation layer has a rectangular opening substantially aligned with the FET device. The rectangular opening has pair of first sides and a pair of second sides. An extending direction of the pair of first sides is perpendicular to an extending direction of the pair of second sides. The pair of first electrodes is disposed over the pair of first sides, and the pair of second electrodes is disposed over the pair of second sides.

20 Claims, 26 Drawing Sheets

SEMICONDUCTOR BIOSENSOR

PRIORITY DATA

This patent is a divisional application of U.S. patent application Ser. No. 16/851,008 filed on Apr. 16, 2020, entitled of "BIOSENSORS, METHOD FOR FORMING THE SAME, AND METHOD OF OPERATING THE SAME", the entire disclosure of which is hereby incorporated by reference.

BACKGROUND

Biosensors are devices for sensing and detecting biomolecules. Typically, biosensors operate on the basis of electronic, electrochemical, optical and mechanical detecting principles. For example, biosensors may include transistors that are able to electrically sense charges, photons and mechanical properties of bio-entities or biomolecules. Accordingly, the biosensor may detect the concentration of bio-entities or biomolecules, or interaction and reaction between specified reactants and bio-entities or biomolecules. Such biosensors are fast in signal conversion and can be manufactured using semiconductor processes and easily applied to integrated circuits (ICs) and microelectromechanical system (MEMS).

A field-effect transistor (FET) device including a source, a drain and a gate can be used as a sensor for various types of targets. For example, a biologically-sensitive FET device, or a bio-organic FET device can be formed to detect biomolecules including, for example but not limited thereto, $H^+$, $Ca^{2+}$, DNA, proteins and glucose.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 13 to 24 are schematic drawings illustrating a biosensor at various stages of the using of the biosensor according to aspects of the present disclosure, wherein FIG. 13 is a cross-sectional view of the biosensor, and FIGS. 14 to 24 are top views of a sensing area of the biosensor.

DETAILED DESCRIPTION

Figure 1A:
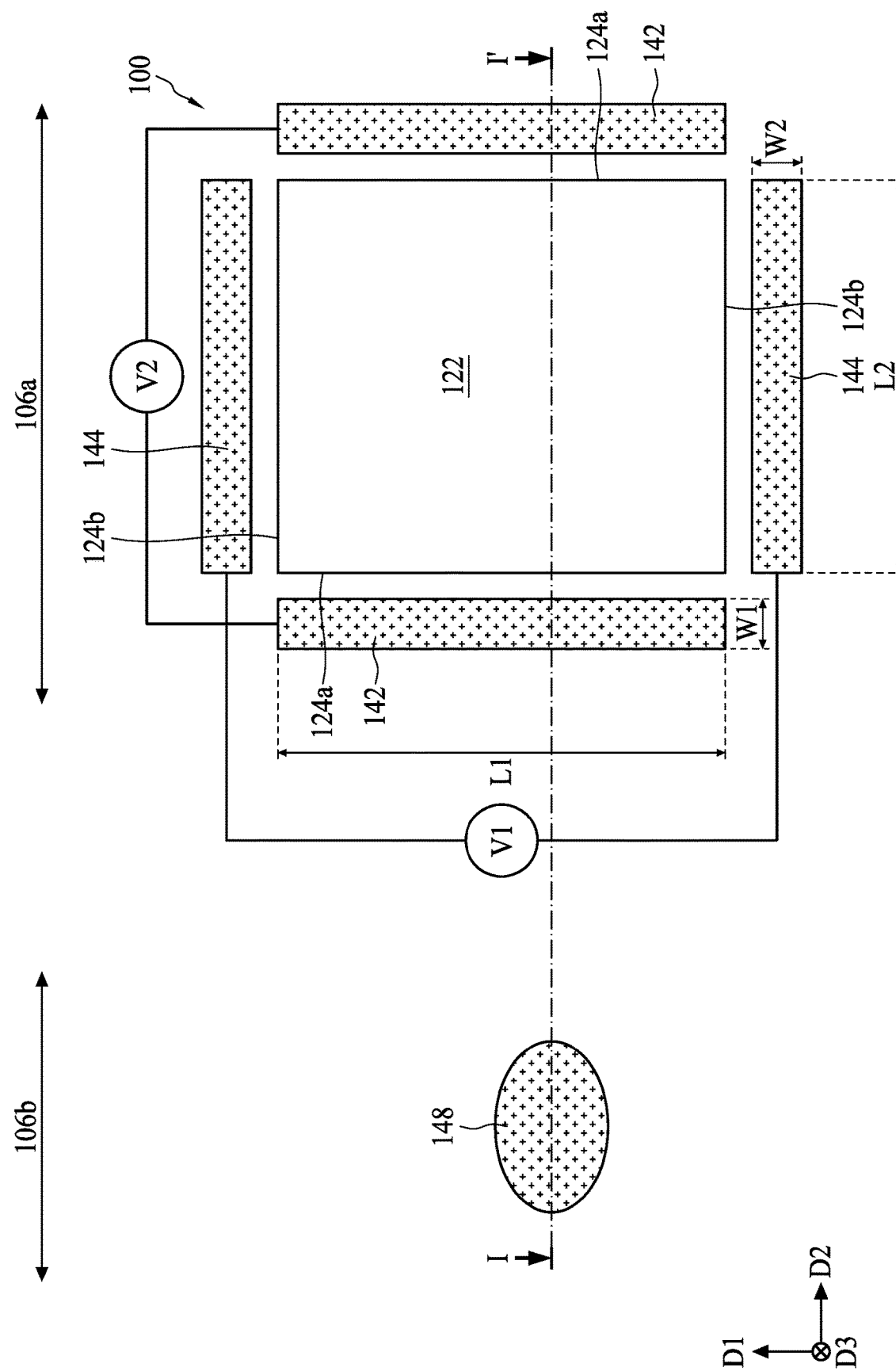
FIG. 1A is a schematic plane view of a biosensor according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any references to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by references to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The acronym "FET," as used herein, refers to a field effect transistor. An example of a type of FET device is a metal oxide semiconductor field effect transistor (MOSFET). In some embodiments, a MOSFET device can be a planar structure built in and on a planar surface of a substrate such as a semiconductor wafer. In other embodiments, a three-dimensional, fin-based MOSFET device can be used.

The term "bioFET" refers to a FET that includes a layer of immobilized capture reagents that act as surface receptors to detect the presence of a target ligand in an analyte of biological origin. A bioFET can be a FET device with a semiconductor transducer, according to some embodiments. One advantage of bioFETs is the prospect of label-free operation. Specifically, bioFETs enable the avoidance of costly and time-consuming labeling operations such as the labeling of an analyte with, for instance, fluorescent or radioactive probes. The analytes for detection by a bioFET will normally be of biological origin, such as—without limitation—proteins, carbohydrates, lipids, tissue fragments, or portions thereof. A bioFET can be part of a broader category of FET sensors that may also detect any chemical compound (known in the art as a "ChemFET") or any other element, including ions such as protons or metallic ions (known in the art as an "ISFET"). This disclosure applies to all types of FET-based sensors ("FET sensor").

The term "quantitation" generally refers to the process of determining the quantity or concentration of a target analyte based on its binding to a capture reagent.

The term "capture reagent" as used herein, is a molecule or compound capable of binding the target analyte or target reagent, which can be directly or indirectly attached to a substantially solid material. The capture reagent can be a chemical, and specifically any substance for which there exists a naturally-occurring target analyte (e.g., an antibody, polypeptide, DNA, RNA, cell, virus, etc.) or for which a target analyte can be prepared, and the capture reagent can bind to one or more target analytes in an assay.

Characterization of interactions between molecule pairs provides the key to a wide spectrum of applications, including drug development, genetic engineering, whole blood detection, etc. In some comparative approaches, a bio-panning technique is a commonly used technique for targeting, sorting and affinity selection. Bio-panning involves a series of lengthy operations and thus efficiency of bio-panning is low. The implementation of targeted DNA assays may use polymerase chain reaction (PCR) amplification or hybridization enrichment. However, the amplification efficiency of PCR is reduced when the DNA sample has low purity. Furthermore, hybridization enrichment may use long oligonucleotides to enhance the returns on investment (ROIs) of specific targets, but also increases non-specific target binding. Therefore hybridization enrichment requires extensive washing and controlled wash conditions to ensure specificity. Further, bio-panning requires more time, for example, more than one month, for selection and sorting.

In other comparative approaches, a microfluidic phage-displayed peptide selection (MiPS) system is provided. However, it is found that the MiPS system involves a series of lengthy operations and thus efficiency of the MiPS system is low. Further, the MiPS system fails to provide quantitation (i.e., phage concentration) after selection and sorting. In some comparative approaches, a continuous microfluidic assortment of interactive ligands (CMAIL) device is provided. In the CMAIL device, phages are loaded and electrophoresed inside an agarose gel coated with target antigens under two alternating electric fields, such as a lateral electric field and a vertical electric field. Negative, or antigen non-interactive, phages migrate diagonally across the agarose gel under both electric fields, while positive, or antigen-interactive, phages migrate only when the stronger electric field is applied. Phages are continuously sorted and collected at different outlets based on their affinity for the target antigen. However, the CMAIL device still fails to provide quantitation (i.e., phage concentration) after selection and sorting.

The present disclosure therefore provides a biosensor for integrating target ligand selection, sorting and detection on one chip. The present disclosure further provides a method for operating the biosensor that includes providing alternating voltages to an analyte, such that a targeting ligand in the analyte may move along two directions or may stay due to binding with the capture reagent. Accordingly, ligand selection and sorting can be achieved by the biosensor and the method of operating the same. Further, the biosensor and the method of operating the same provide quantitation of target ligands in the analyte by detecting a voltage difference.

Figure 1B:
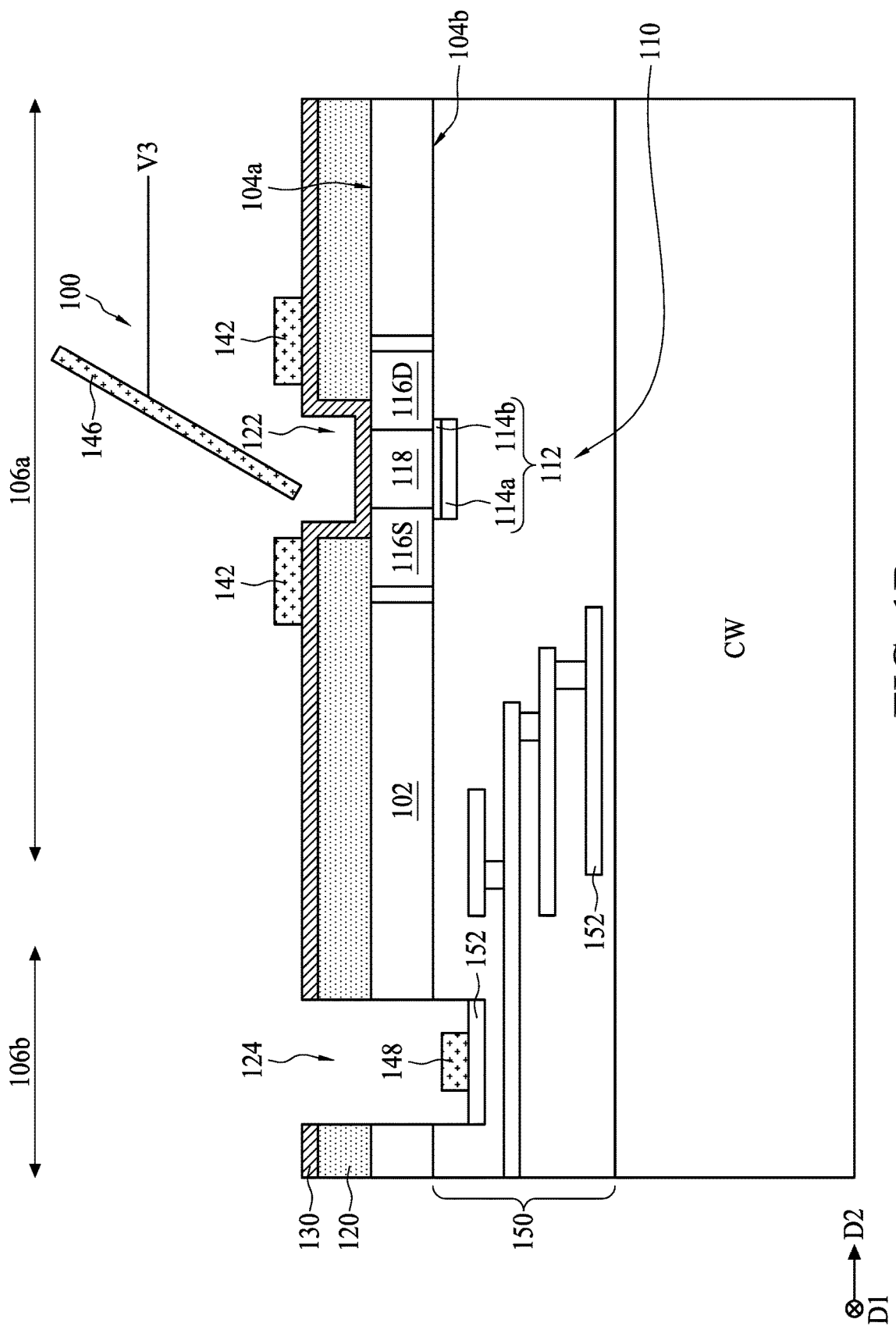
FIG. 1B is a cross-sectional view taken along line I-I' of FIG. 1A.

FIG. 1A is a schematic plane view of a biosensor according to aspects of the present disclosure in one or more embodiments, and FIG. 1B is a cross-sectional view taken along line I-F of FIG. 1A. In some embodiments, a biosensor 100 is provided. In some embodiments, the biosensor 100 can be accommodated over a carrier wafer CW, but the disclosure is not limited thereto. The biosensor 100 includes a semiconductor layer 102. The semiconductor layer 102 has a first surface 104a and a second surface 104b opposite to the first surface 104a. The semiconductor layer 102 can include an elementary semiconductor such as silicon or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the semiconductor layer 102 may include doped regions, such as p-wells and n-wells.

A FET device 110 is formed in the semiconductor layer 102. The FET device 110 may be an n-type FET (nFET) or a p-type FET (pFET). The FET device 110 includes a gate structure 112, a source 116S, a drain 116D and a channel region 118. As shown in FIG. 1B, the gate structure 112 is disposed over the second surface 104b of the semiconductor layer 102. The gate structure 112 includes a gate electrode 114a and a gate dielectric layer 114b. In some embodiments, the gate electrode 114a includes polysilicon. In other embodiments, the gate electrode 114a can include metal such as Cu, W, Ti, Ta, Cr, Pt, Ag, Au; suitable metallic compound like TiN, TaN, NiSi, CoSi; combinations thereof; and/or other suitable conductive materials. The gate dielectric layer 114b is disposed between the gate electrode 114a and the semiconductor layer 102. In some embodiments, the gate dielectric layer 114b can include silicon oxide. In other embodiments, the gate dielectric layer 114b can include silicon nitride, silicon oxynitride, a dielectric with a high dielectric constant (high-k), or a combination thereof. Examples of high-k materials include hafnium silicate, hafnium oxide, zirconium oxide, aluminum oxide, tantalum pentoxide, hafnium dioxide-alumina ($HfO_2Al_2O_3$) alloy, and combinations thereof. The source 116S, the drain 116D, and the channel region 118 between the source 116S and the drain 116D are formed in an active region of the semiconductor layer 102. The source 116S and the drain 116D may include n-type dopants or p-type dopants depending on the FET configuration. Further, as shown in FIG. 1B, the source 116S and the drain 116D extend from the first surface 104a to the second surface 104b of the semiconductor layer 102. In some embodiments, the FET device 110 can be referred to as a bioFET device.

The biosensor 100 further includes an isolation layer 120 disposed over the first surface 104a of the semiconductor layer 102. As shown in FIGS. 1A and 1B, an opening 122 is formed in the isolation layer 120. In some embodiments, the opening 122 is a rectangular opening substantially aligned with the FET device 110. For example, the rectangular opening 122 may substantially overlap the channel region 118 of the FET device 110. In some embodiments, the opening 122 exposes a portion of the first surface 104a of the semiconductor layer 102. For example, the opening 122 may expose the channel region 118. In other embodiments, the opening 122 may expose the channel region 118, a portion of the source 116S and a portion of the drain 116D, but the disclosure is not limited thereto. In some embodiments, the opening 122 has a pair of first sides 124a and a pair of second sides 124b. As shown in FIG. 1A, the pair of first sides 124a are perpendicular to the pair of second sides 124b. In some embodiments, a length of the pair of first sides 124a is greater than a length of the pair of second sides 124b.

The biosensor 100 further includes a dielectric layer 130 disposed over the isolation layer 120 and the first surface 104a of the semiconductor layer 102. Accordingly, the dielectric layer 130 covers sidewalls and a bottom of the opening 122. Further, the dielectric layer 130 covers regions exposed through the bottom of the opening 122. For example, the channel region 118 is covered by the dielectric layer 130, as shown in FIG. 1B. The dielectric layer 130 is compatible with binding of biomolecules or bio-entities and thus serves as a sensing film for the biosensor 100. In some embodiments, the dielectric layer 130 may include a high-k dielectric material such as, for example but not limited thereto, hafnium silicate, hafnium oxide, zirconium oxide, aluminum oxide, tantalum pentoxide, hafnium dioxide-alumina ($HfO_2$—$Al_2O_3$) alloy, or combinations thereof. The dielectric layer 130 may provide a binding interface for biomolecules or bio-entities and act as a support for the attachment of capture reagents as will be discussed in more detail below in the section directed to biological sensing. In some embodiments, capture reagents such as an enzyme, antibody, ligand, peptide, nucleotide, cell of an organ, organism, or piece of tissue can be placed on the dielectric layer 130 for detection of a target biomolecule.

In some embodiments, the biosensor 100 further includes a pair of first electrodes 142, a pair of second electrodes 144 and a third electrode 146. The pair of first electrodes 142 and the pair of second electrodes 144 are disposed over the dielectric layer 130. Further, the first electrodes 142 and the second electrodes 144 are separated from each other, as shown in FIG. 1A. An extending direction of the pair of second electrodes 144 is perpendicular to an extending direction of the pair of first electrodes 142. In some embodiments, the pair of first electrodes 142 extends along a first direction D1, the pair of second electrodes 144 extends along a second direction D2, and the first direction D1 and the second direction D2 are perpendicular. In some embodiments, the pair of first electrodes 142 is disposed over the pair of first sides 124a of the opening 122. Additionally, the pair of first electrodes 142 may be disposed adjacent to an edge of the first sides 124a. The pair of second electrodes 144 is disposed over the pair of second sides 124b of the opening 122. Additionally, the pair of second electrodes 144 may be disposed adjacent to an edge of the second sides 124b. Further, a length L1 of the first electrodes 142 is substantially equal to a length of the first sides 124a, and a length L2 of the second electrodes 144 is substantially equal to a length of the second sides 124b, as shown in FIG. 1A.

In some embodiments, the biosensor 100 further includes a third electrode 146 disposed over the rectangular opening 122 and separated from the first surface 104a of the semiconductor layer 102. Further, the third electrode 146 is physically and electrically separated from the pair of first electrodes 142 and the pair of second electrodes 144. In some embodiments, the third electrode 146 can substantially overlap the FET device 110, as shown in FIG. 1B.

In some embodiments, the pair of first electrodes 142 is electrically connected to a voltage source V2, the pair of second electrodes 144 is electrically connected to a voltage source V1, and the third electrode 146 is electrically connected to a voltage source V3. In some embodiments, the voltage source V1 provides a voltage to the pair of second electrodes 144, and the voltage source V2 provides a voltage to the pair of first electrodes 142. The voltage provided to the pair of second electrodes 144 is greater than the voltage provided to the pair of first electrodes 142. The details of the voltages will be discussed below.

Still referring to FIG. 1B, the biosensor 100 further includes an interconnect structure 150 disposed over the second surface 104b of the semiconductor layer 102. In some embodiments, the interconnect structure 150 is disposed between the semiconductor layer 102 and the carrier wafer CW, but the disclosure is not limited thereto. The interconnect structure 150 is provided to make electrical connection with various doped regions and other devices formed within the semiconductor layer 102.

In some embodiments, the semiconductor layer 102 can be defined to have a biosensor region 106a and a bonding region 106b. As shown in FIGS. 1A and 1B, the biosensor 100 is disposed in the biosensor region 106a, and at least a connecting pad 148 is disposed in the bonding region 106b. Further, the connecting pad 148 is coupled to the interconnect structure 150. The connecting pad 148 can be used for various applications, such as probing and/or bonding. In some embodiments, the connecting pad 148 used in bonding is referred to as a bonding pad. In some embodiments, the connecting pad 148 can have size and strength sufficient to withstand physical contact due to actions such as probing or bonding. Further, as shown in FIG. 1B, in some embodiments, a trench 124 can be formed to penetrate the dielectric layer 130, the isolation layer 120, the semiconductor layer 102 and a portion of the interconnect structure 150, and the connecting pad 148 can be disposed in the trench 124 and coupled to the interconnect structure 150. In some embodiments, the connecting pad 148 can be referred to as being "buried" in the interconnect structure 150, and the buried connecting pad 148 helps to provide strong bonding, which reduces the likelihood of peeling.

In some embodiments, the pair of first electrodes 142, the pair of second electrodes 144 and the connecting pad 148 can include a same material, but the disclosure is not limited thereto. In such embodiments, the pair of first electrodes 142, the pair of second electrodes 144 and the connecting pad 148 can include a metal material, such as aluminum, copper, aluminum-copper, titanium, tantalum, titanium nitride, tantalum nitride, tungsten, or an alloy thereof, but the disclosure is not limited thereto. In some embodiments, a thickness of the pair of first electrodes 142, a thickness of the pair of second electrodes 144, and a thickness of the connecting pad 148 are substantially the same.

Figure 2:
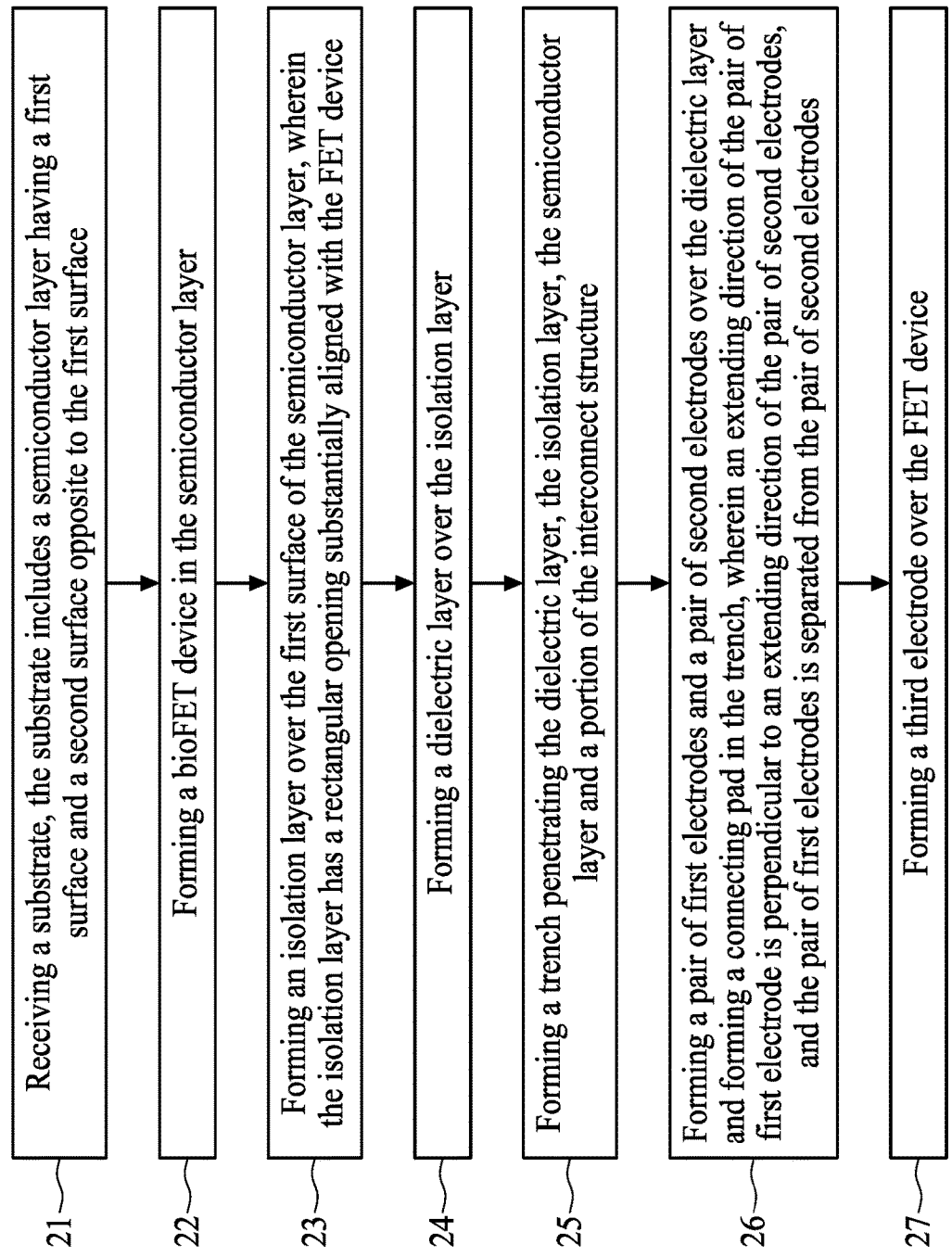
FIG. 2 is a flowchart representing a method for forming a biosensor according to aspects of the present disclosure.
Figure 3:
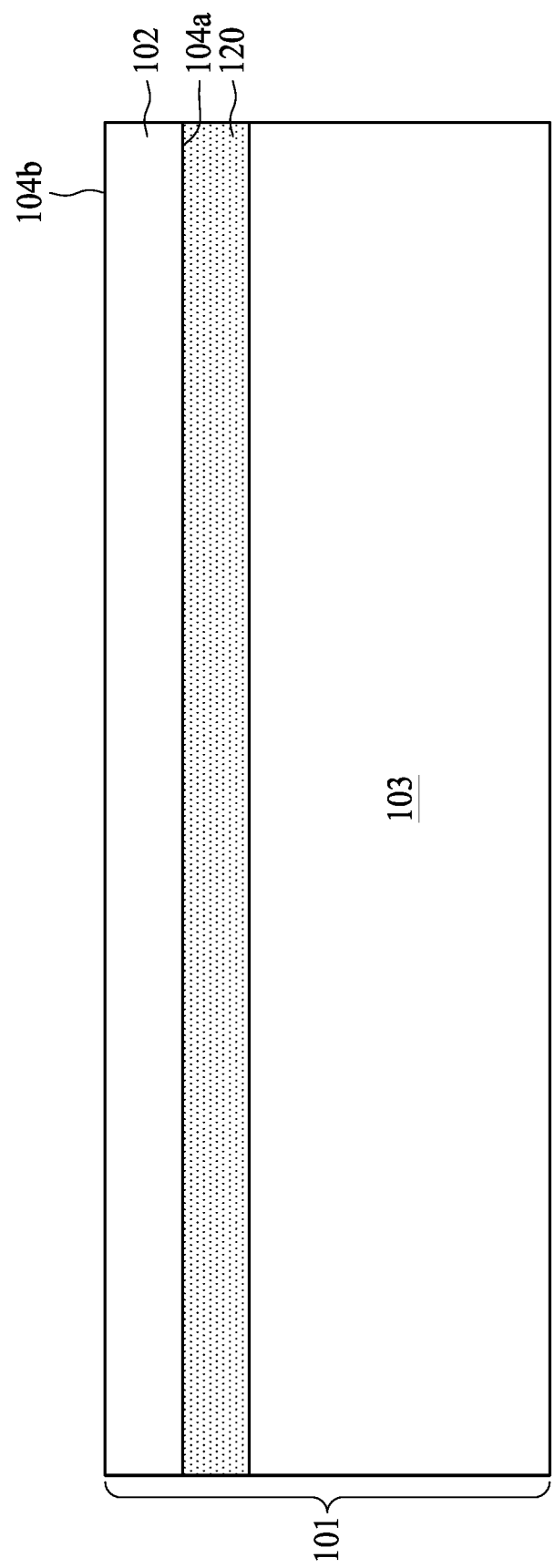
FIGS. 3 to 11 are schematic drawings of a biosensor at various stages of fabrication according to aspects of the present disclosure in one or more embodiments.

FIG. 2 is a flowchart representing a method for forming a biosensor 20 according to aspects of the present disclosure. The method 20 includes a number of operations (21, 22, 23, 24, 25, 26 and 27). The method 20 will be further described according to one or more embodiments. It should be noted that the operations of the method 20 may be rearranged or otherwise modified within the scope of the various aspects. It should be further noted that additional processes may be provided before, during, and after the method 20, and that some other processes may be only briefly described herein. Thus, other implementations are possible within the scope of the various aspects described herein.

FIGS. 3 to 11 are schematic drawings of a biosensor at various stages of formation according to aspects of the present disclosure in one or more embodiments. At operation 21, a substrate 101 is received. In some embodiments, the substrate 101 can be a silicon-on-insulator (SOI) substrate, but the disclosure is not limited thereto. For example, the substrate 101 can include a bulk 103, a semiconductor layer 102 and an isolation layer 120 between the bulk 103 and the semiconductor layer 102. In some embodiments, the isolation layer 120 can be referred to as a buried oxide (BOX) layer formed by a process such as separation by implanted oxygen (SIMOX), or another suitable process. The semiconductor layer 102 can include material as mentioned above; therefore, repetitive descriptions are omitted in the interest of brevity. Further, the semiconductor layer 102 has a first surface 104a facing the isolation layer 120 and a second surface 104b opposite to the first surface 104a. In some embodiments the second surface 104b of the semiconductor layer 102 can be a surface exposed for forming devices. In some embodiments, the semiconductor layer 102 may include doped regions, such as p-wells and n-wells.

Figure 4:
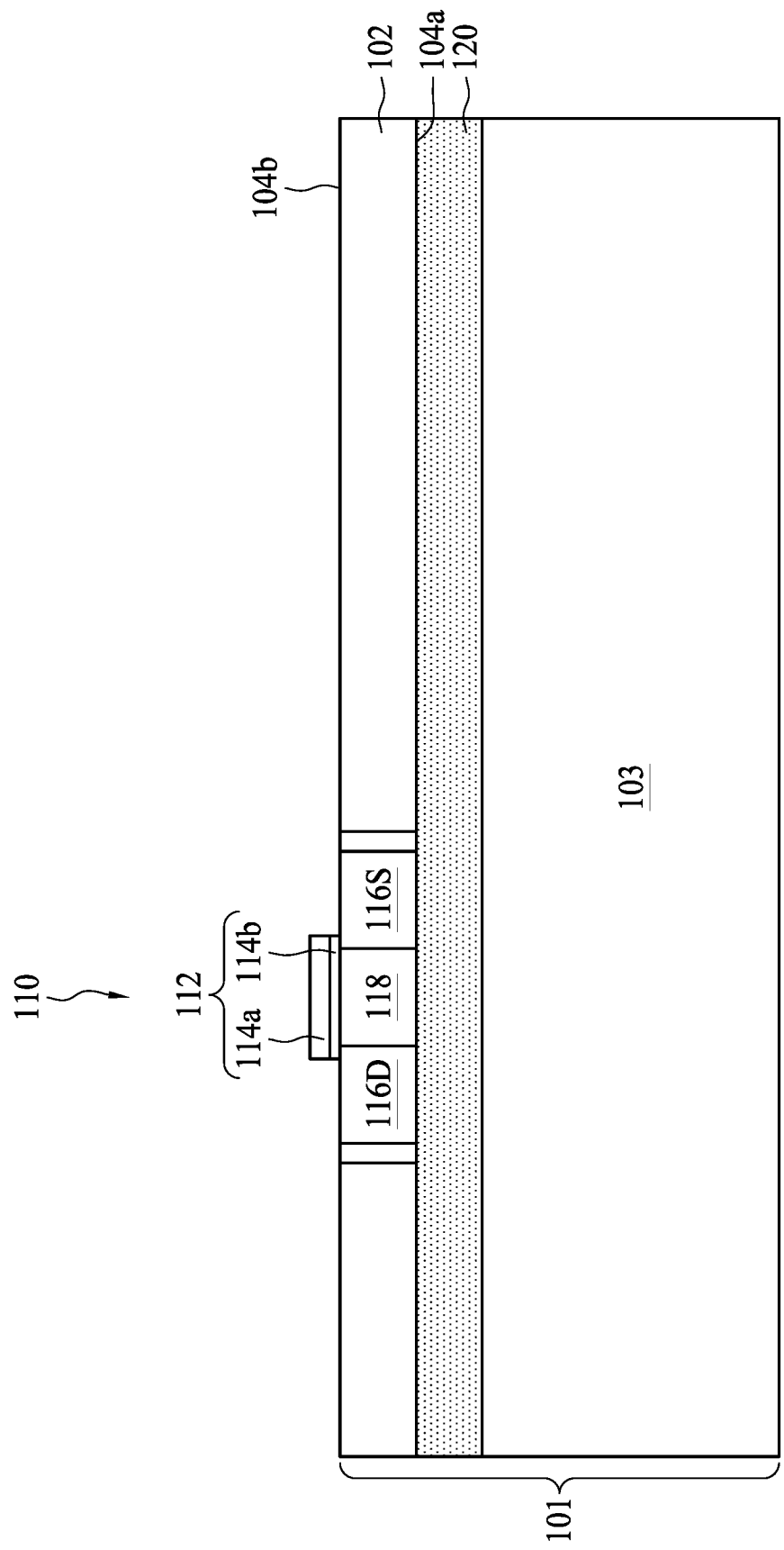

Referring to FIG. 4, at operation 22, a bioFET device 110 is formed in the semiconductor layer 102. In some embodiments, the bioFET device 110 includes a gate structure 112, a source 116S, a drain 116D, and a channel region 118. As mentioned above, the gate structure 112 can include a gate electrode 114a and a gate dielectric layer 114b between the semiconductor layer 102 and the gate electrode 114a. Materials used to form the gate electrode 114a and the gate dielectric layer 114b can be the same as those mentioned above; therefore, details are omitted for brevity. The source 116S, the drain 116D, and the channel region 118 between the source 116S and the drain 116D are formed in an active region of the semiconductor layer 102. The bioFET device 110 can be formed by using typical CMOS fabrication operations such as photolithography; ion implantation; diffusion; deposition including physical vapor deposition (PVD), metal evaporation or sputtering, chemical vapor deposition (CVD), plasma-enhanced CVD (PECVD), atmospheric pressure CVD (APCVD), low-pressure CVD (LPCVD), high-density plasma CVD (HDP-CVD), atomic layer deposition (ALD), spin on coating; etching including wet etching, dry etching, and plasma etching; and other suitable CMOS fabrication operations.

Figure 5:
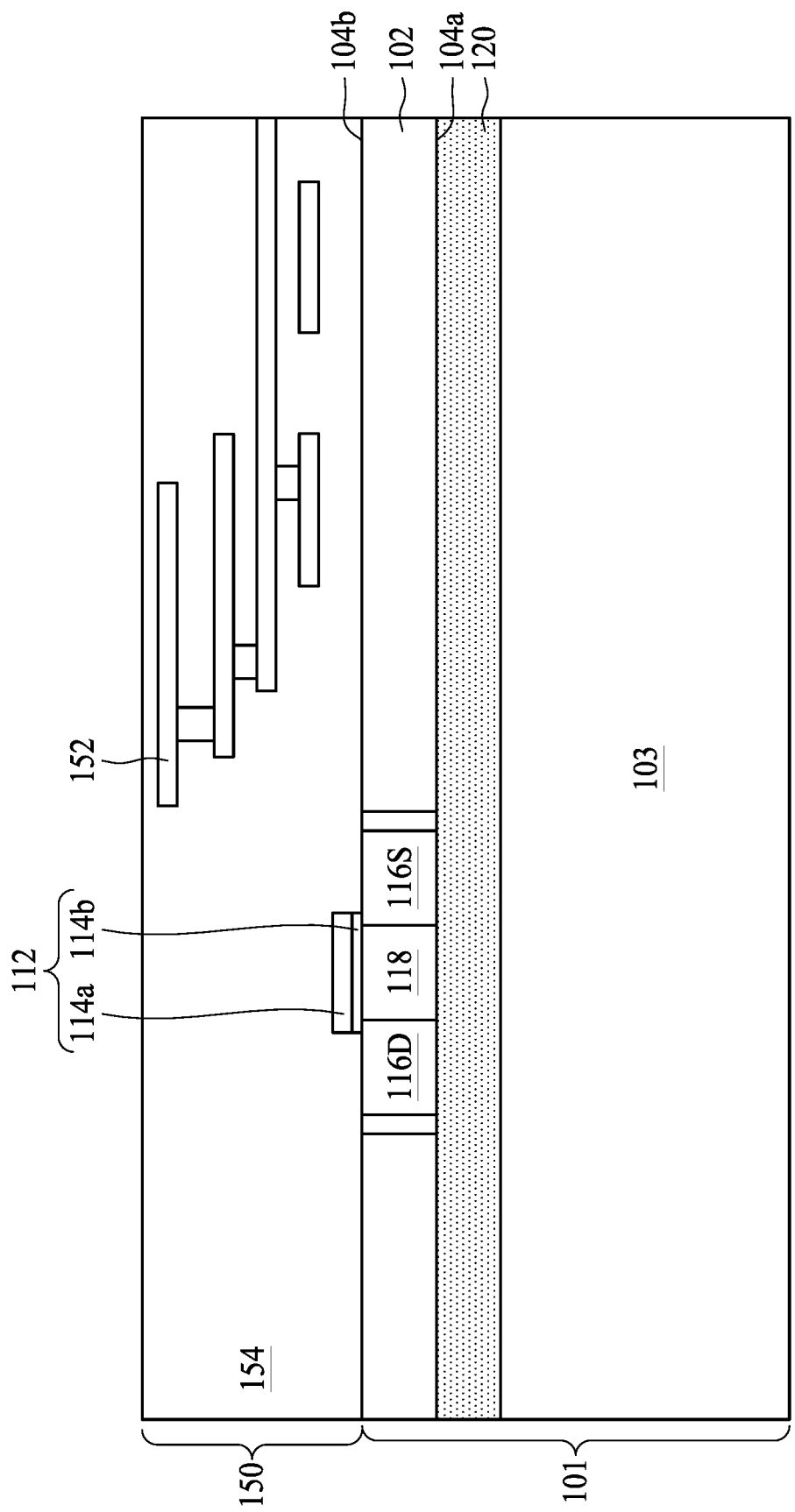

Referring to FIG. 5, in some embodiments, an interconnect structure 150 is formed over the substrate 101. In some embodiments, the interconnect structure 150 is formed on the second surface 104b of the semiconductor layer 102. The interconnect structure 150 can be a back-end-of-line (BEOL) metallization stack which includes a plurality of metallization layers including conductive contacts/vias and conductors 152 stacked in interlayer dielectric (ILD) layers 154. The interconnect structure 150 is provided to make electrical connection with various doped regions and other devices formed within the semiconductor layer 102.

Figure 6:
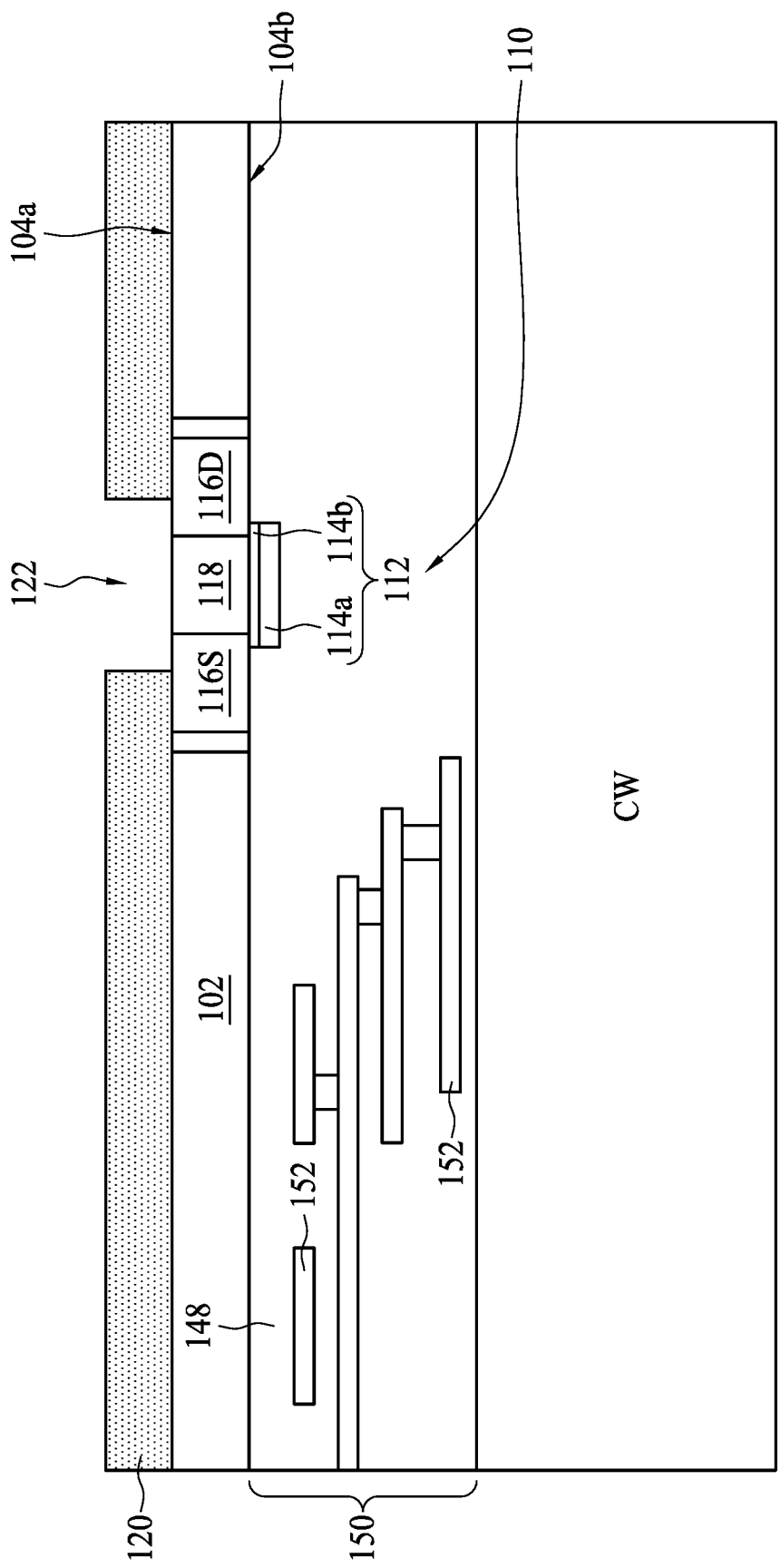

At operation 23, an isolation layer 120 is formed over the first surface 104a of the semiconductor layer 102. Referring to FIG. 6, in some embodiments, the isolation layer 120 can be obtained by providing a carrier wafer CW over the second surface 104b of the semiconductor layer 102. In some embodiments, the interconnect structure 150 can be attached to the carrier wafer CW, as shown in FIG. 6. Subsequently, the bulk 103 of the substrate 101 is removed to expose the isolation layer 120 of the SOI substrate 101. However, the forming of the isolation layer 120 is not limited to this. In some other embodiments, when a silicon substrate is used, the silicon substrate can be thinned after attaching the interconnect structure 150 to the carrier wafer CW, and an isolation layer 120 is formed over the thinned silicon substrate.

Still referring to FIG. 6, the isolation layer 120 has a rectangular opening 122 substantially aligned with the FET device 110. In some embodiments, the opening 122 may be formed using suitable photolithography processes to provide a pattern on the isolation layer 120 and etching processes to remove materials from the isolation layer 120 until the first surface 104a of the semiconductor layer 102 is exposed. The etching processes include wet etch, dry etch, plasma etch and/or other suitable processes. In some embodiments, a portion of the first surface 104a of the semiconductor layer 102 is exposed through a bottom of the opening 122. In some embodiments, the opening 122 has a pair of first sides 124a and a pair of second sides 124b, as shown in FIG. 1A. The pair of first sides 124a is perpendicular to the pair of second sides 124b. In some embodiments, a length of the pair of first sides 124a is greater than a length of the pair of second sides 124b.

Figure 7:
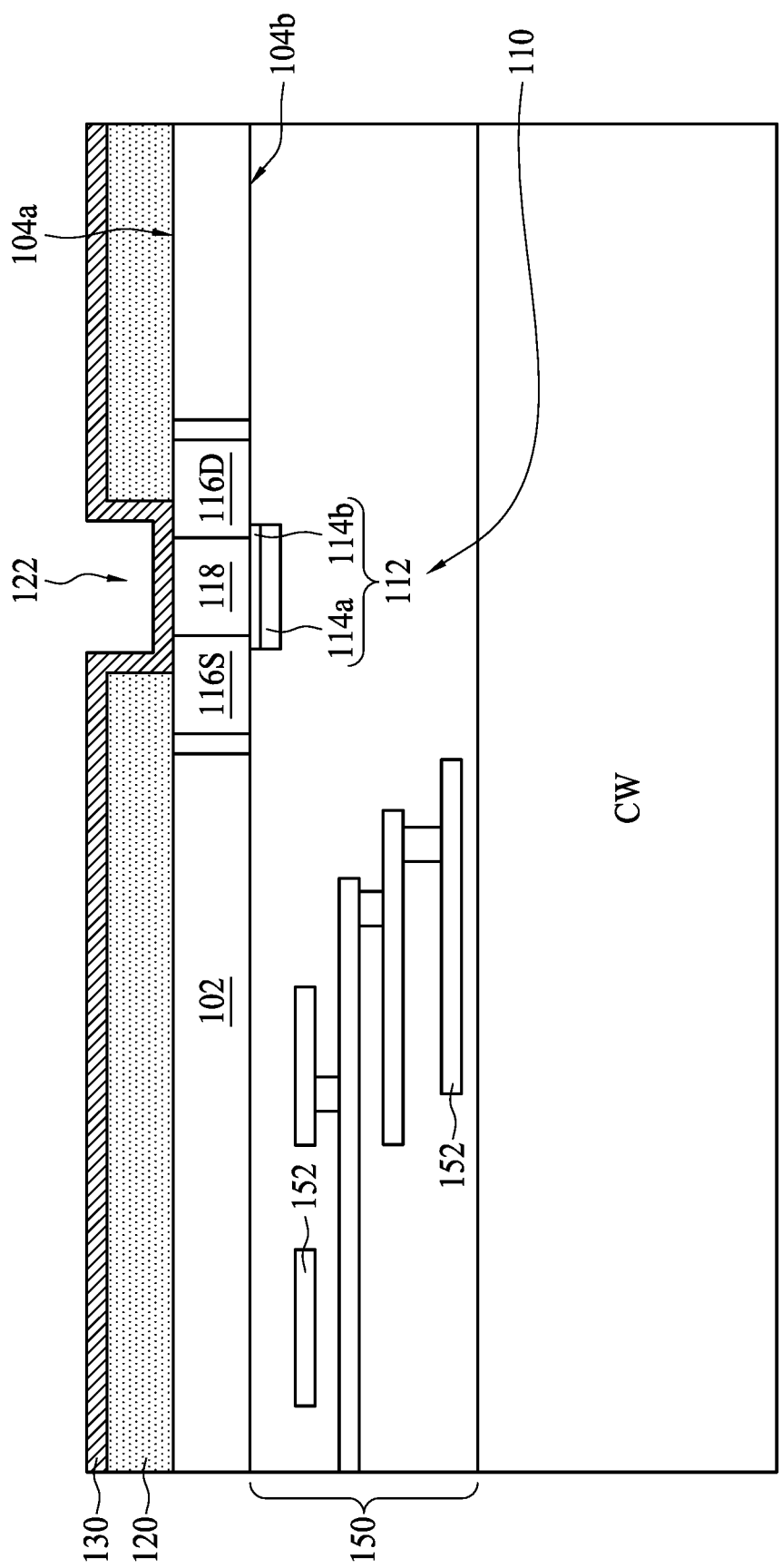

At operation 24, a dielectric layer 130 is formed over the isolation layer 120. Referring to FIG. 7, the dielectric layer 130 covers sidewalls and a bottom of the opening 122. Further, the dielectric layer 130 covers regions exposed through the bottom of the opening 122. For example, the channel region 118 exposed through the bottom of the opening 122 is covered by the dielectric layer 130, as shown in FIGS. 6 and 7. The dielectric layer 130 is compatible with binding of biomolecules or bio-entities and thus serves as a sensing film for the biosensor 100. Materials used to form the dielectric layer 130 can be the same as those described above; therefore, details are omitted for brevity. As mentioned above, the dielectric layer 130 may provide a binding interface for biomolecules or bio-entities and act as a support for the attachment of capture reagents, as will be discussed in more detail below in the section directed to biological sensing. The dielectric layer 130 can be formed using CMOS fabrication operations such as, for example but not limited thereto, PVD, CVD, PECVD, APCVD, LPCVD, HDP-CVD, or ALD. In some embodiments, the dielectric layer 130 may include a plurality of layers. A receptor or a capture reagent such as an enzyme, antibody, ligand, peptide, nucleotide, cell of an organ, organism, or piece of tissue is placed on the dielectric layer 130 for detection of a target biomolecule.

Figure 8:
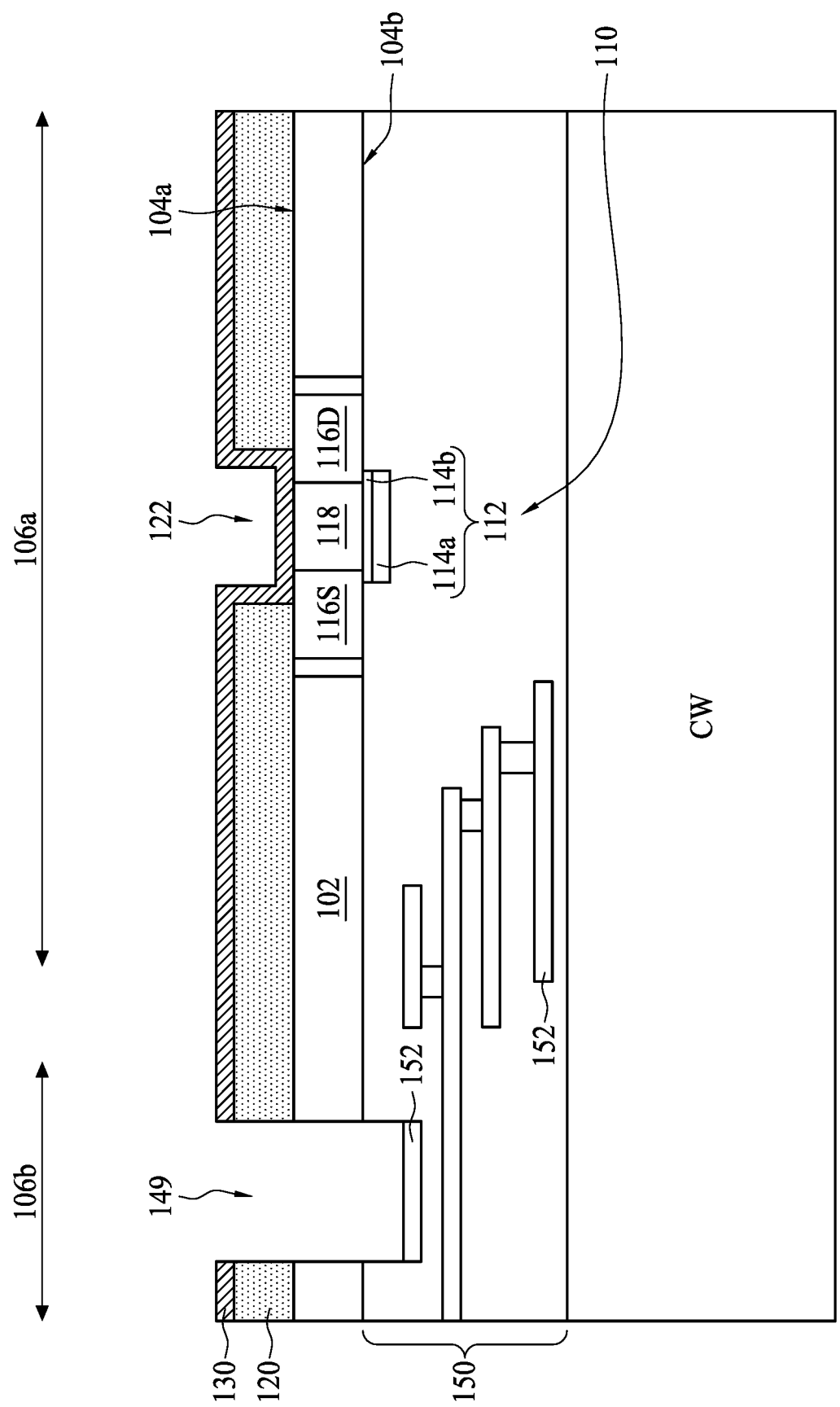

At operation 25, a trench 149 penetrating the dielectric layer 130, the isolation layer 120, the semiconductor layer 102 and a portion of the interconnect structure 150 is formed. In some embodiments, the semiconductor layer 102 can be defined to have a biosensor region 106a and a bonding region 106b. The trench 124 is formed in the bonding region 106b, as shown in FIG. 8. Further, a portion of the conductors 152 in the interconnect structure 150, such as the lowest conductor 152 in the interconnect structure 150, is exposed through a bottom of the trench 124.

Figure 9:
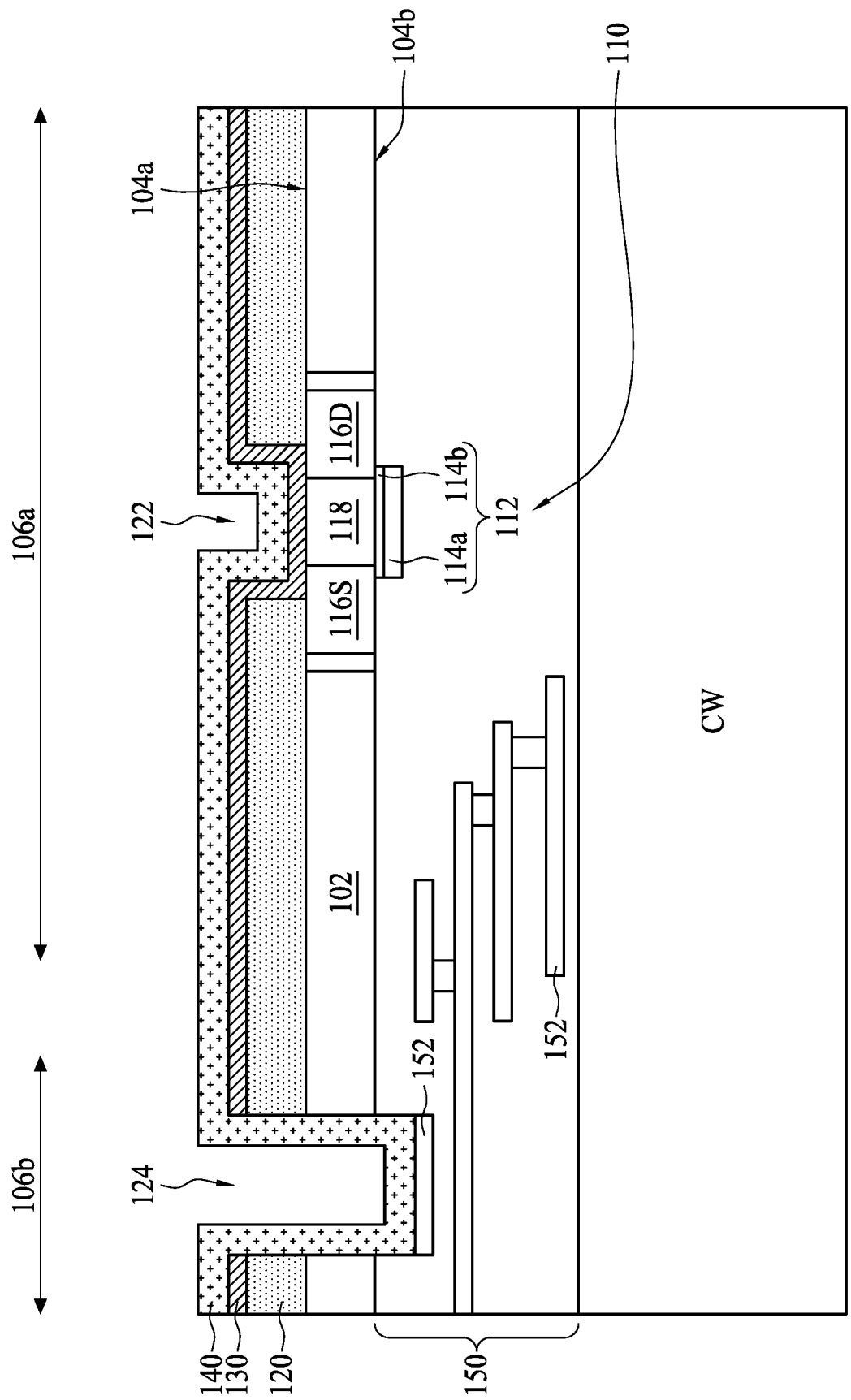

Referring to FIG. 9, a conductive layer 140 is formed on the dielectric layer 130. The conductive layer 140 may cover sidewalls and the bottom of the trench 124. Materials used to form the conductive layer 140 can be the same as those described above; therefore, details are omitted. A thickness of the conductive layer 140 is between approximately 0.5 μm and approximately 140 μm, but the disclosure is not limited thereto. In some embodiments, the conductive layer 140 may be in contact with the lowest conductor 152 exposed through the trench 124, as shown in FIG. 9.

Figure 10:
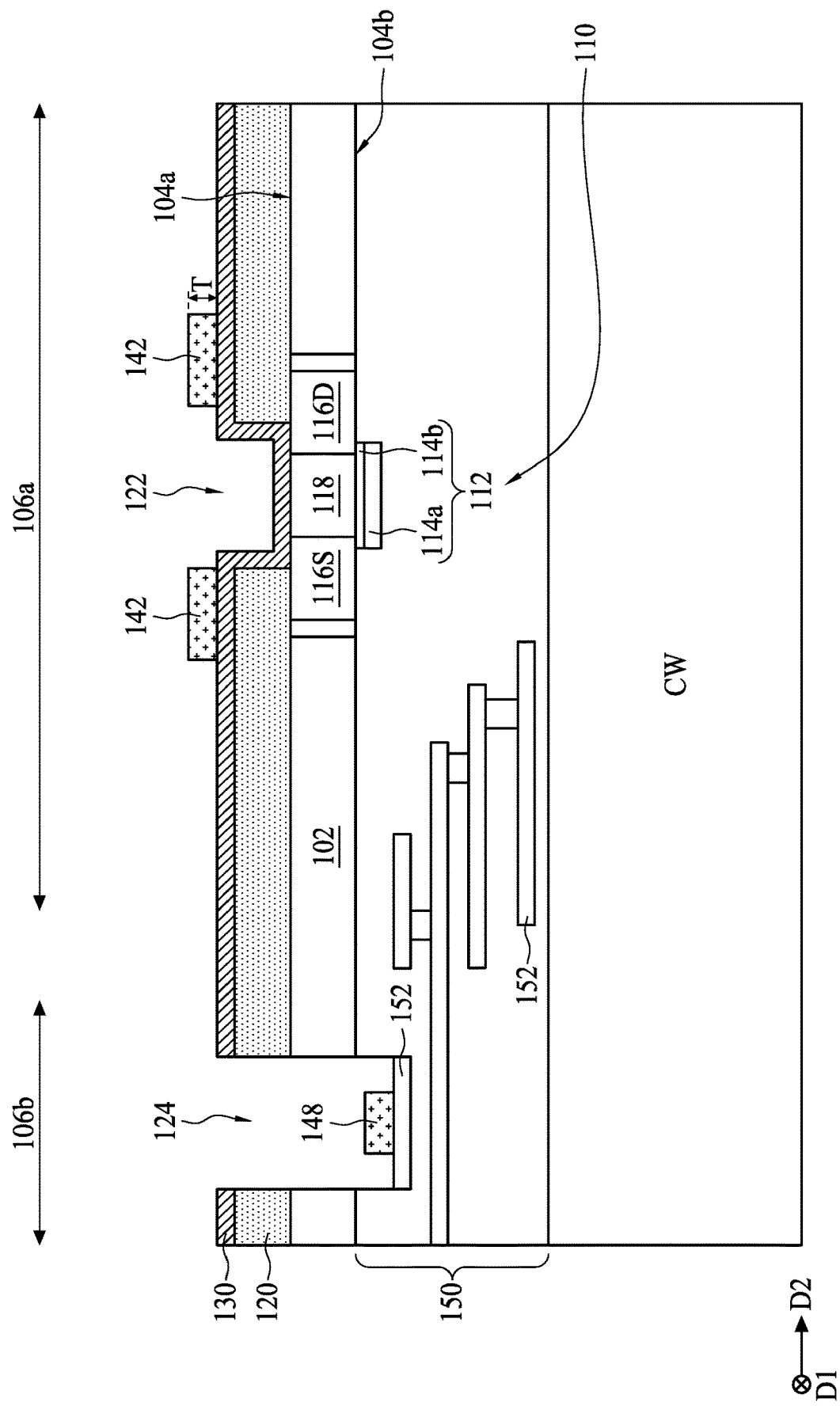

Referring to FIG. 10, in some embodiments, the conductive layer 140 is patterned to form the pair of first electrodes 142, the pair of second electrodes 144 and a connecting pad 148 at operation 26. Referring to FIGS. 1A and 10, the pair of first electrodes 142 is disposed over the pair of first sides 124a of the opening 122, and the pair of second electrodes 144 is disposed over the pair of second sides 124b of the opening 122 in the biosensor region 106a. In contrast to the pair of first electrodes 142 and the pair of second electrodes 144, the connecting pad 148 is formed in the trench 124 in the bonding region 106b. An extending direction of the pair of first electrodes 142 is perpendicular to an extending direction of the pair of second electrodes 144. Further, the pair of first electrodes 142 is separated from the pair of second electrodes 144.

In some embodiments, a length L1 of the first electrodes 142 is substantially equal to a length of the first sides 124a, and a length L2 of the second electrodes 144 is substantially equal to a length of the second sides 124b, as shown in FIG. 1A. In some embodiments, a length L1 of the first electrodes 142 and a length L2 of the second electrodes 144 respectively are between approximately 2.5 μm and approximately 700 μm, but the disclosure is not limited thereto. However, the length L1 of the first electrodes 142 is greater than the length L2 of the second electrodes 144. In some embodiments, a width W1 of the first electrodes 142 and a width W2 of the second electrodes 144 respectively are between approximately 0.5 μm and approximately 200 μm, but the disclosure is not limited thereto. In some embodiments, a width W1 of the first electrodes 142 is substantially equal to a width W2 of the second electrodes 144, but the disclosure is not limited thereto.

In some embodiments, each of the first electrodes 142 has a ratio of the length L1 to the width W1, and the ratio of the length L1 to the width W1 is less than approximately 5. In some embodiments, the ratio of the length L1 to the width W1 is between approximately 3 and approximately 5. In some embodiments, each of the second electrodes 144 has a ratio of the length L2 to the width W2, and the ratio of the length L2 to the width W2 is less than approximately 5. In some embodiments, the ratio of the length L2 to the width W2 is between approximately 3 and approximately 5. In some comparative approaches, when the ratio of the length to the width of the first and second electrodes 142 and 144 is greater than 5, a peeling issue of the electrodes 142 and 144 from the dielectric layer 130 may arise. In some comparative approaches, when the ratio of the length to the width of the first and second electrodes 142 and 144 is less than 3, a resistance of the electrodes 142 and 144 may be unwantedly increased.

The first electrodes 142 and the second electrodes 144 include a same thickness T that is equal to the thickness of the conductive layer 140. In some embodiments, each of the first electrodes 142 has a ratio of the length L1 to the thickness T, and the ratio of the length L1 to the thickness T is less than approximately 5. In some embodiments, the ratio of the length L1 to the thickness T is between approximately 3 and approximately 5. In some embodiments, each of the second electrodes 144 has a ratio of the length L2 to the thickness T, and the ratio of the length L2 to the thickness T is less than approximately 5. In some embodiments, the ratio of the length L2 to the thickness T is between approximately 3 and approximately 5. In some comparative approaches, when the ratio of the length to the thickness of the first and second electrodes 142 and 144 is greater than 5, a peeling issue of the electrodes 142 and 144 from the dielectric layer 130 may arise. In some comparative approaches, when the ratio of the length to the thickness of the first and second electrodes 142 and 144 is less than 3, a resistance of the electrodes 142 and 144 may be unwantedly increased.

Further, each of the first electrodes 142 has a ratio of the width W1 to the thickness T, and the ratio of the width W1 to the thickness T is less than approximately 3. In some embodiments, the ratio of the width W1 to the thickness T is between approximately 2 and approximately 3. In some embodiments, each of the second electrodes 144 has a ratio of the width W2 to the thickness T, and the ratio of the width W2 to the thickness T is less than approximately 3. In some embodiments, the ratio of the width W2 to the thickness T is between approximately 2 and approximately 3. In some comparative approaches, when the ratio of the width to the thickness of the first and second electrodes 142 and 144 is greater than 3, a peeling issue of the electrodes 142 and 144 from the dielectric layer 130 may arise. In some comparative approaches, when the ratio of the width to the thickness of the first and second electrodes 142 and 144 is less than 2, a resistance of the electrodes 142 and 144 may be unwantedly increased.

Figure 11:
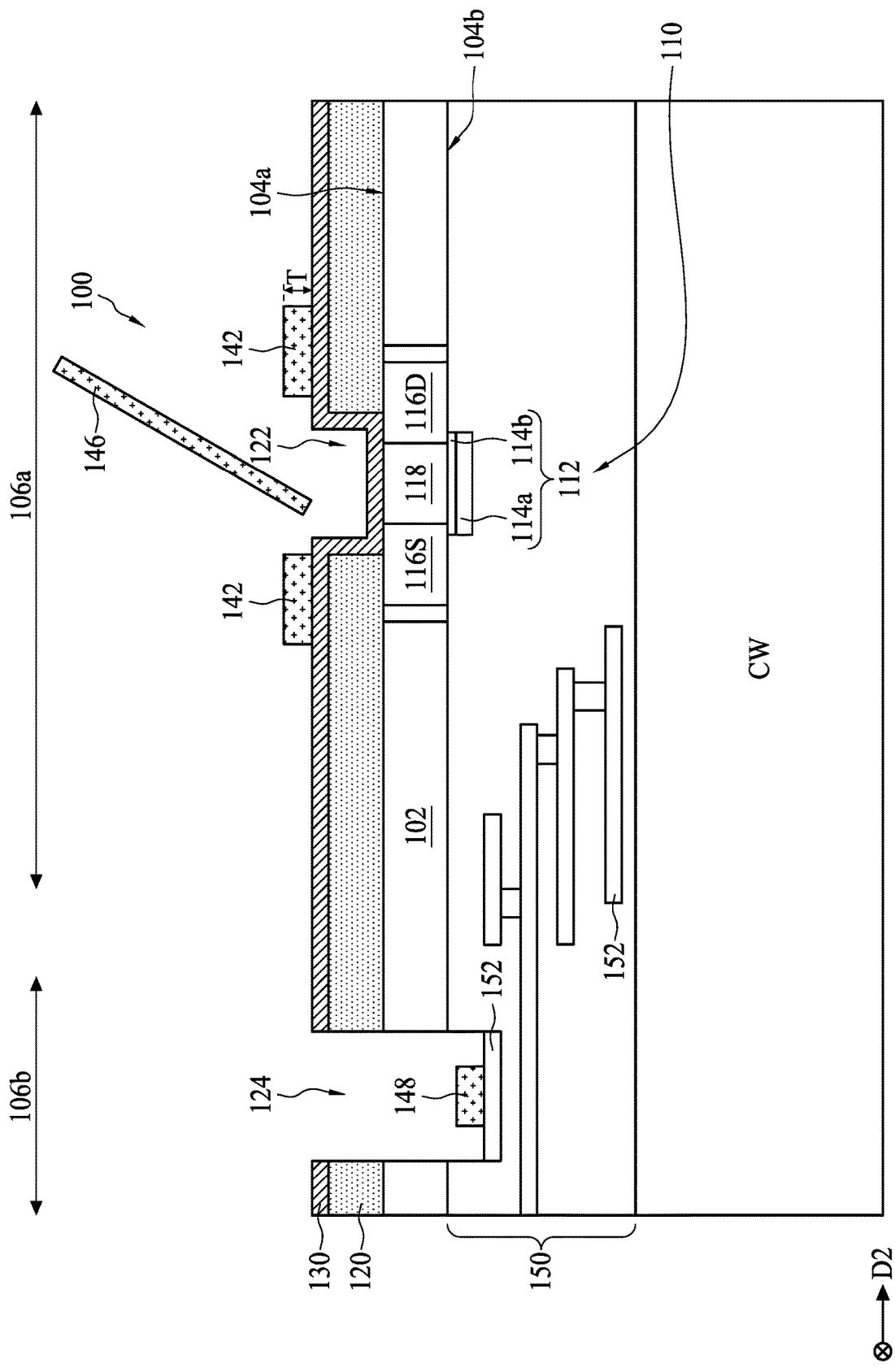

At operation 27, a third electrode 146 is formed over the FET device 110. As shown in FIG. 11, the third electrode 146 can be formed over the rectangular opening 122 and separated from the first surface 104a of the semiconductor layer 102. Further, the third electrode 146 is physically and electrically separated from the pair of first electrodes 142 and the pair of second electrodes 144. In some embodiments, the third electrode 146 can substantially overlap the bioFET device 110.

Accordingly, a biosensor 100 is obtained as shown in FIG. 11. Further, in some embodiments, the pair of first electrodes 142 is electrically connected to a voltage source V2, the pair of second electrodes 144 is electrically connected to a voltage source V1, and the third electrode 146 is electrically connected to a voltage source V3, as shown in FIGS. 1A and 1B. In some embodiments, the voltage source V1 provides a voltage to the pair of second electrodes 144, the voltage source V2 provides a voltage to the pair of first electrodes 142. As mentioned above, the voltage provided to the pair of second electrodes 144 is greater than the voltage provided to the pair of first electrodes 142. The details of the first voltage and second voltage will be discussed below. It should be noted that the voltage provided to the second electrodes 144 is greater than the voltage provided to the first electrodes 142 because the length of the first sides 124a is greater than the length of the second sides 124b.

Figure 12:
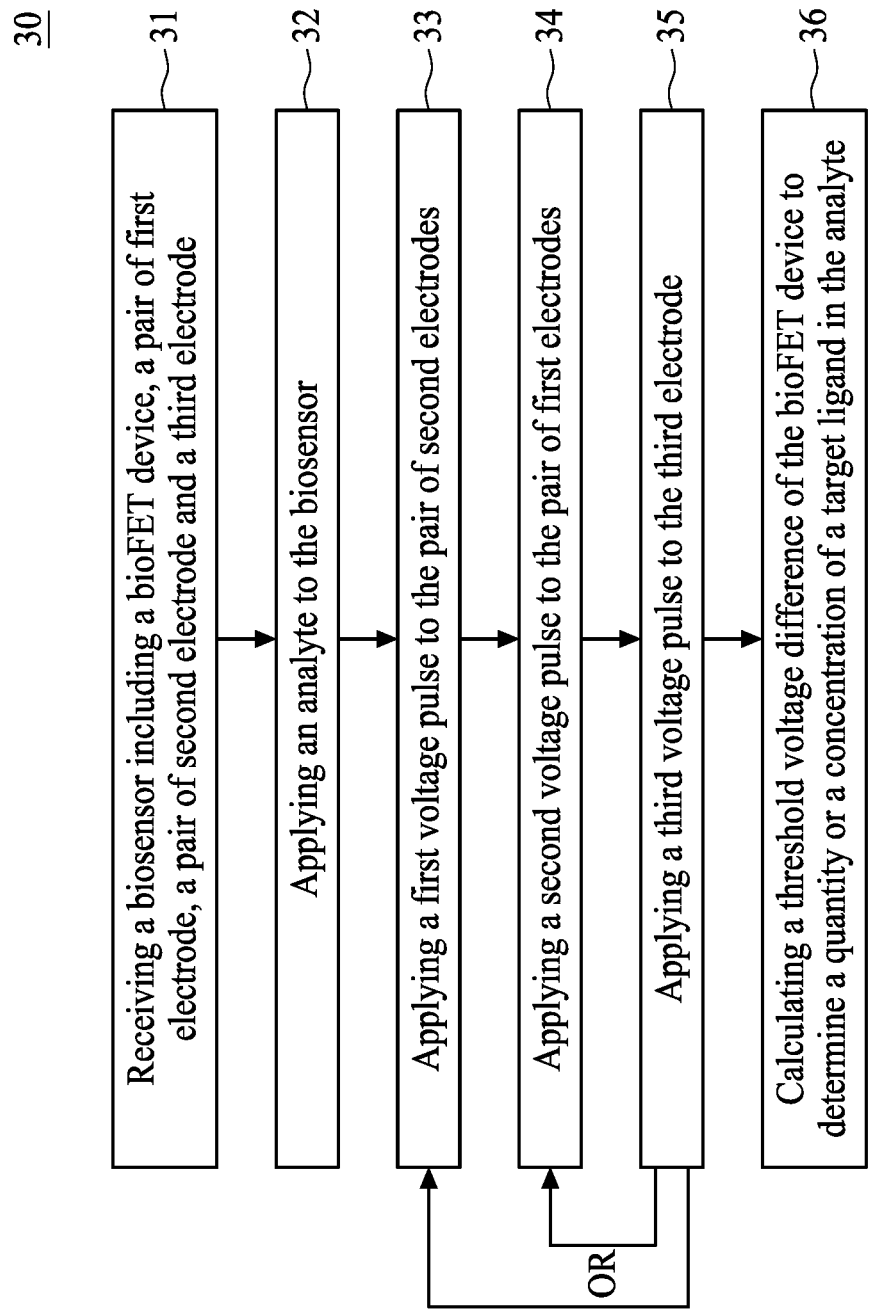
FIG. 12 is a flowchart representing a method for using a biosensor according to aspects of the present disclosure.

FIG. 12 is a flowchart representing a method for operating a biosensor 30 according to aspects of the present disclosure. The method 30 includes a number of operations (31, 32, 33, 34, 35 and 36). The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein. Thus, other implementations are possible within the scope of the various aspects described herein.

It should be noted that the biosensor 100 and the method 30 of the disclosure can be used to detect and/or monitor interactions between various entities. These interactions include biological and chemical reactions to detect target analytes in a test sample. As an example, reactions, including physical, chemical, biochemical, or biological transformations, can be monitored to detect generation of intermediates, byproducts, products, and combinations thereof. In addition the biosensor 100 and the method 30 of the disclosure can be used to detect these reactions in various assays as described herein, including, but not limited to, circulating tumor cell assays used in liquid biopsies and chelation assays to detect the presence of heavy metals and other environmental pollutants. Such assays and reactions can be monitored in a single format or in an array format to detect, e.g., multiple target analytes.

At operation 31, a biosensor is received. In some embodiments, the biosensor can be the biosensor 100 as mentioned above and shown in FIGS. 1A and 1B; therefore, details are omitted for brevity.

Figure 13:
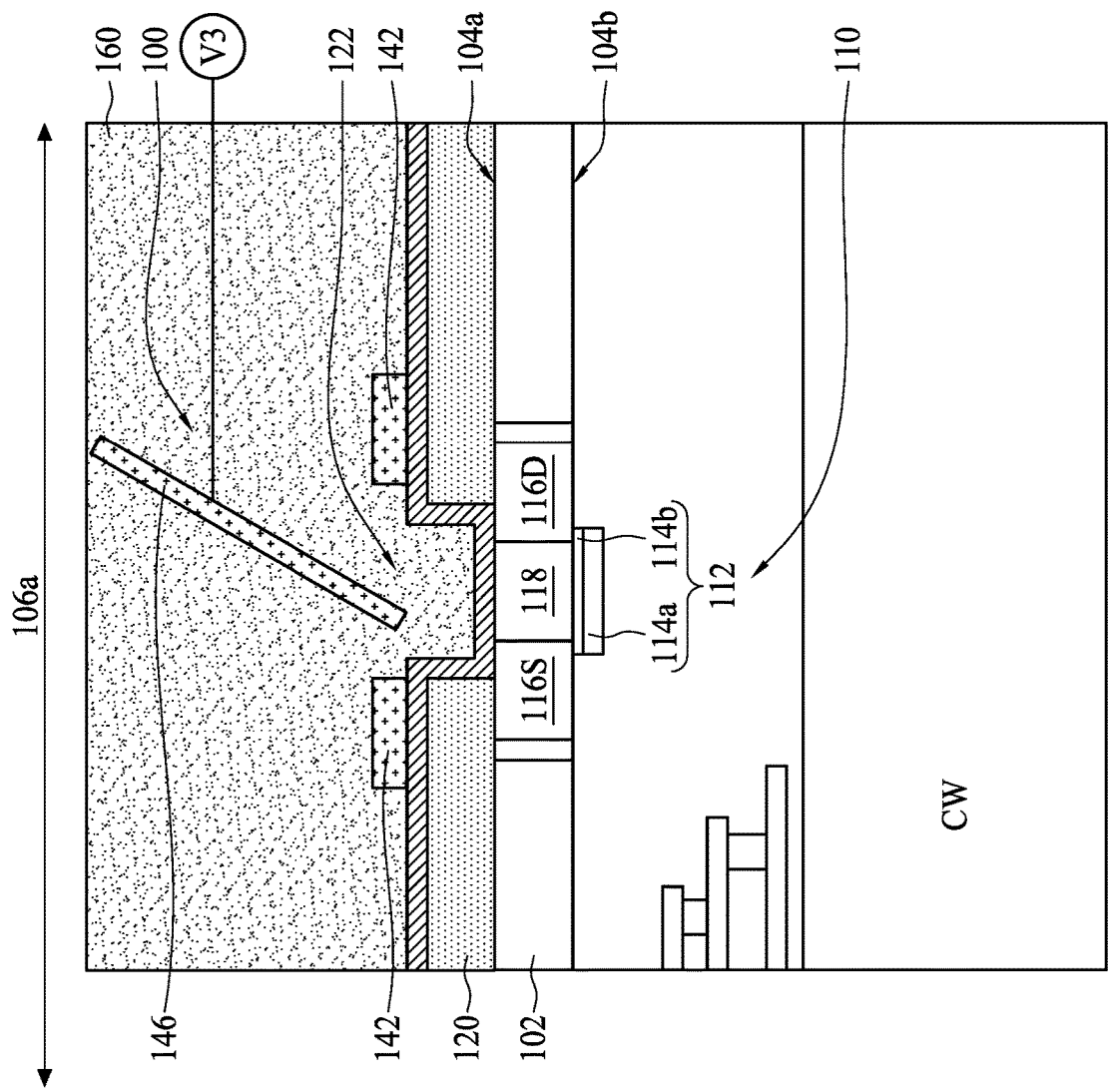
Figure 14:
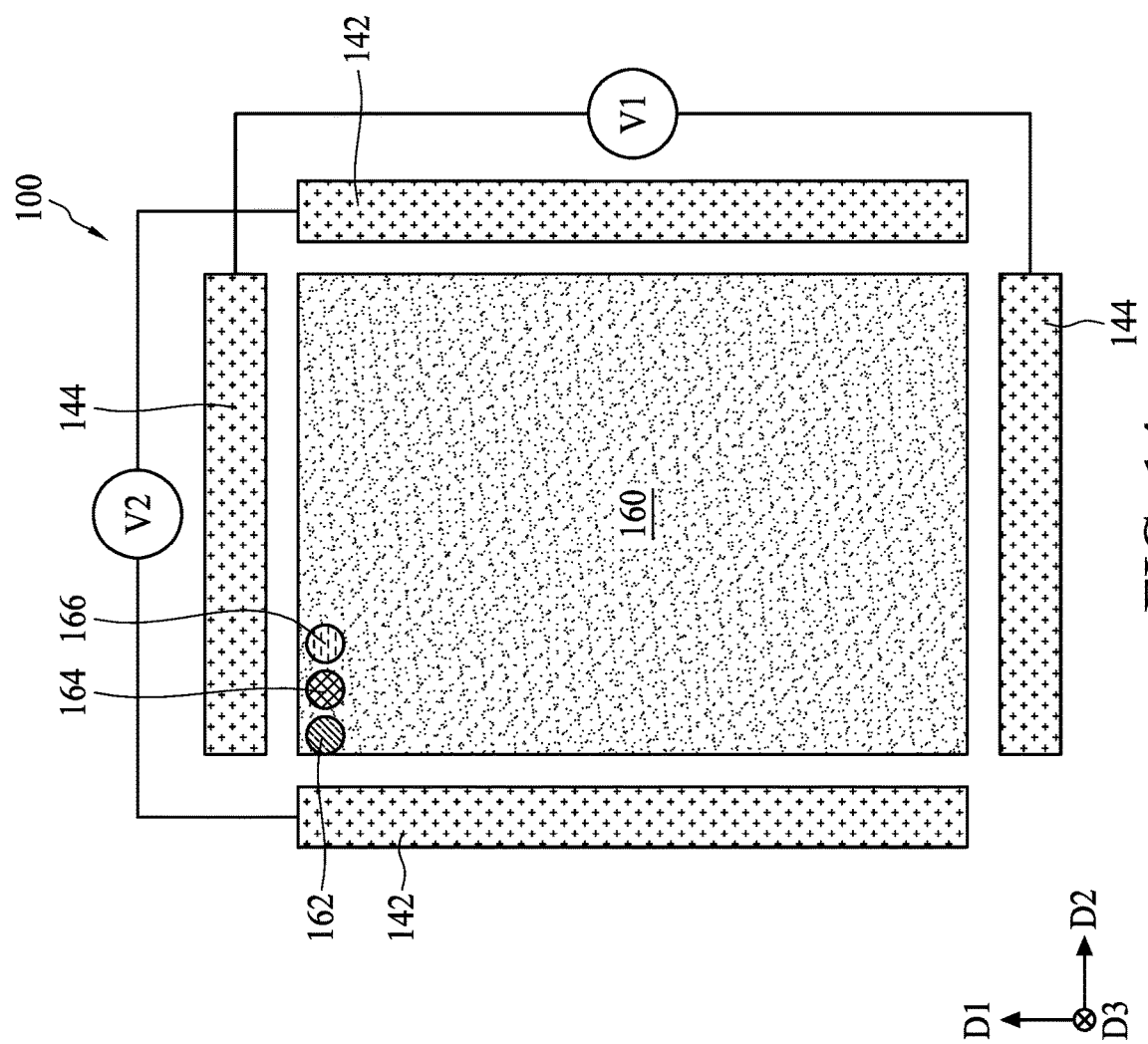

FIGS. 13 to 24 are schematic drawings illustrating a biosensor at various stages of the using of the biosensor according to aspects of the present disclosure, wherein FIG. 13 is a cross-sectional view of the biosensor, and FIGS. 14 to 24 are top view of a sensing area of the biosensor. In some embodiments, the sensing area can be substantially equal to the rectangular opening 122 of the biosensor 100. Referring to FIGS. 13 and 14, at operation 32, an analyte 160 is applied to the biosensor 100. In some embodiments, the analyte 160 may fill the opening 122.

The analyte 160 can include various ligands 162, 164 and 166. In some embodiments, the ligands 162, 164, 166 include single-stranded DNA sequences that may bind strongly to a matching DNA (or probe DNA), and a biosensor including the matching DNA as a capture reagent applied on the sensing film (i.e., the dielectric layer) 130 is used. For example, one of the ligands 162, 164 and 166 including single-stranded DNAs in the analyte 160 may have nucleic acid sequence TCGA binding to its complementary matched strand having nucleic acid sequence AGCT. Any unmatched sequences will not hybridize with the DNA sequences. In some embodiments, the ligands 162, 164 166 may include antigens and a biosensor including antibodies as a capture reagent applied on the sensing film 130 is used. In such embodiments, matching antigens will bind to the immobilized antibodies while unmatched antigens will not bind.

Figure 15:
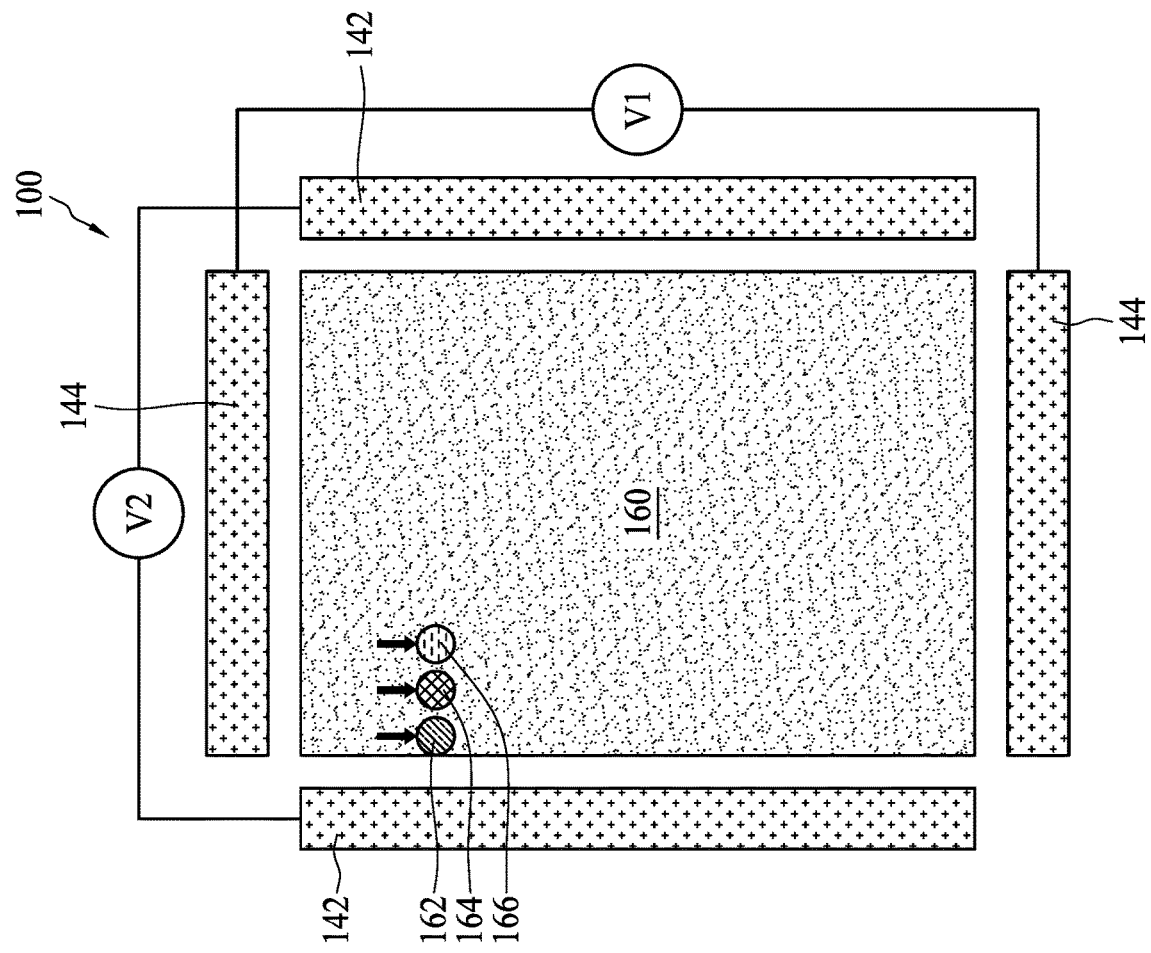
Figure 15:
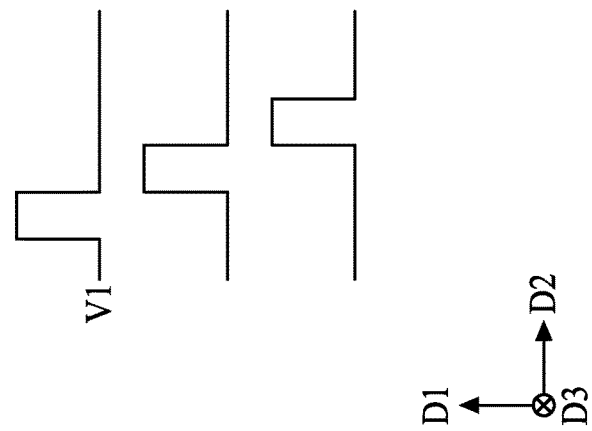

At operation 33, a first voltage pulse is applied to the pair of second electrodes 144. In some embodiments, the first voltage pulse is applied to the pair of second electrodes 144 through the voltage source V1. As shown in FIG. 15, in some embodiments, the ligands 162, 164 and 166 may be moved along the first direction D1 due to an electric field created by the applied first voltage pulse.

Figure 16:
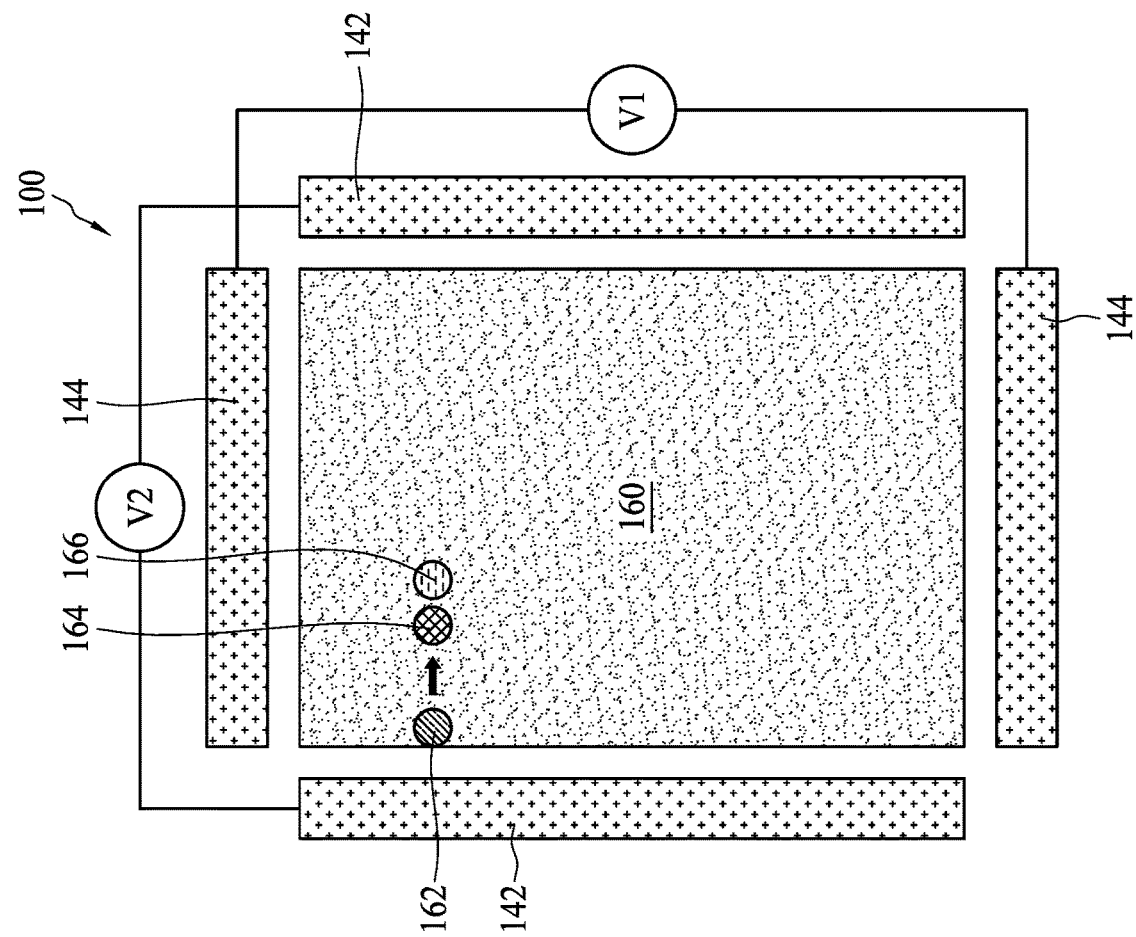
Figure 16:
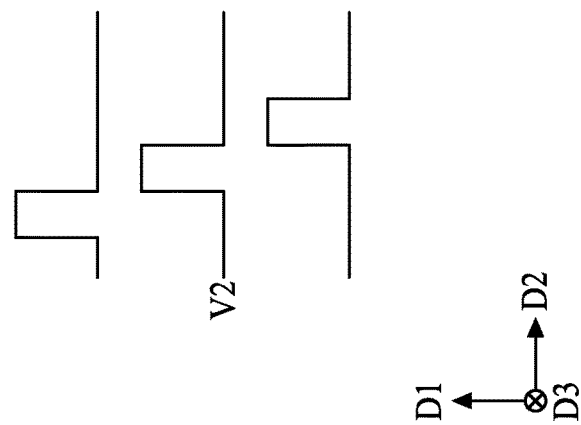

At operation 34, a second voltage pulse is applied to the pair of first electrodes 142. In some embodiments, the second voltage pulse is applied to the pair of first electrodes 142 through the voltage source V2. As shown in FIG. 16, in some embodiments, the ligands 162 may be bound to the matching capture reagents and thus the ligand 162 is not moved by an electric field created by the second voltage pulse at operation 34. In contrast to the ligand 162, the ligands 164 and 166, which are not bound to the matching capture reagents, may be moved along the second direction D2 due to an electric field created by the applied second voltage.

Figure 17:
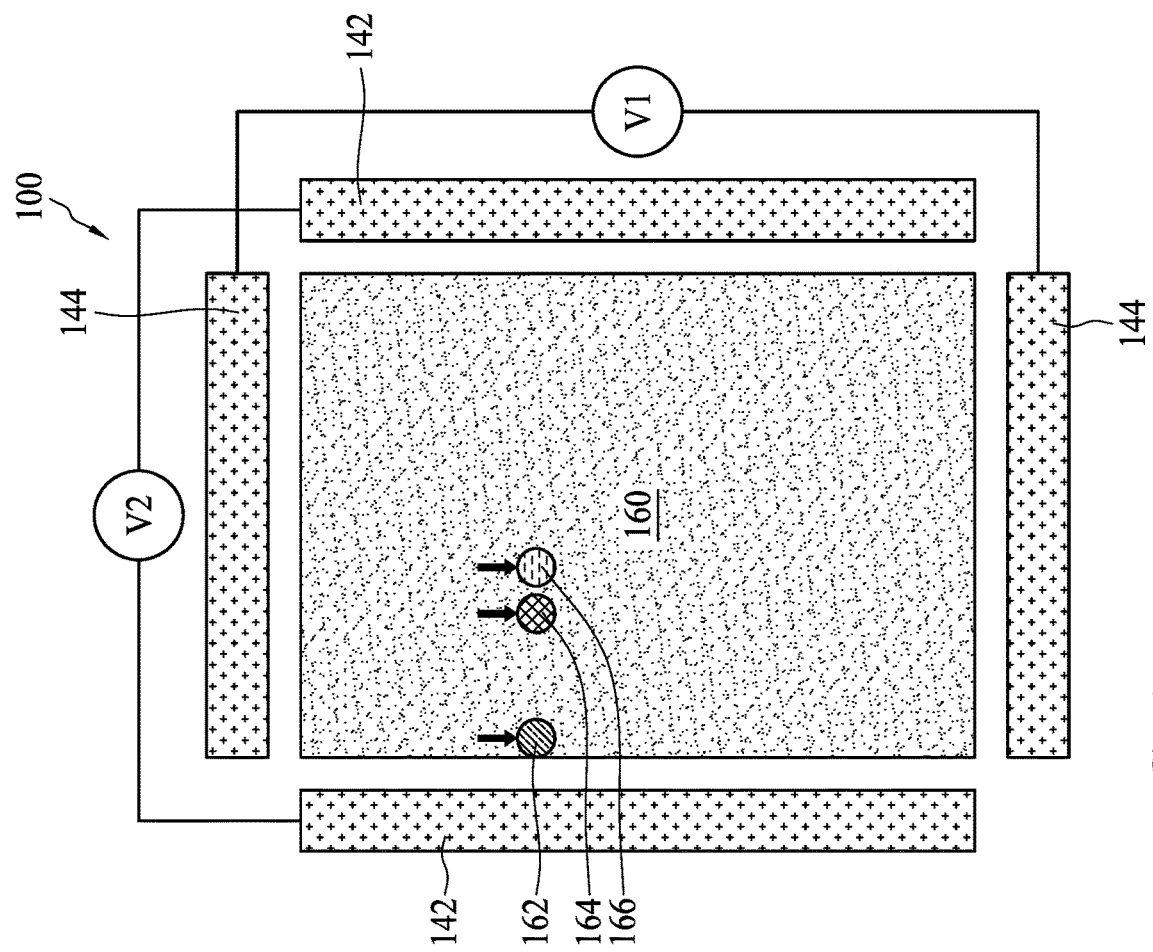
Figure 17:
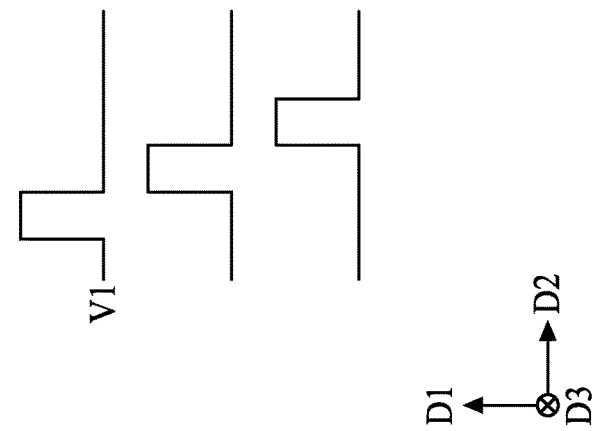

In some embodiments, operation 33 and operation 34 are repeatedly performed. In some embodiments, a magnitude of the first voltage pulse is greater than a magnitude of the second voltage pulse. As shown in FIG. 17, at the repeatedly performed operation 33, the first voltage pulse is applied to the pair of second electrodes 144. In some embodiments, the magnitude of the first voltage pulse applied to the second electrodes 144 at operation 33 is sufficient to break the binding between the matching ligands 162 and the capture reagent; therefore all the ligands 162, 164 and 166 can be moved along the first direction D1 due to the electric field created by the applied first voltage pulse.

Figure 18:
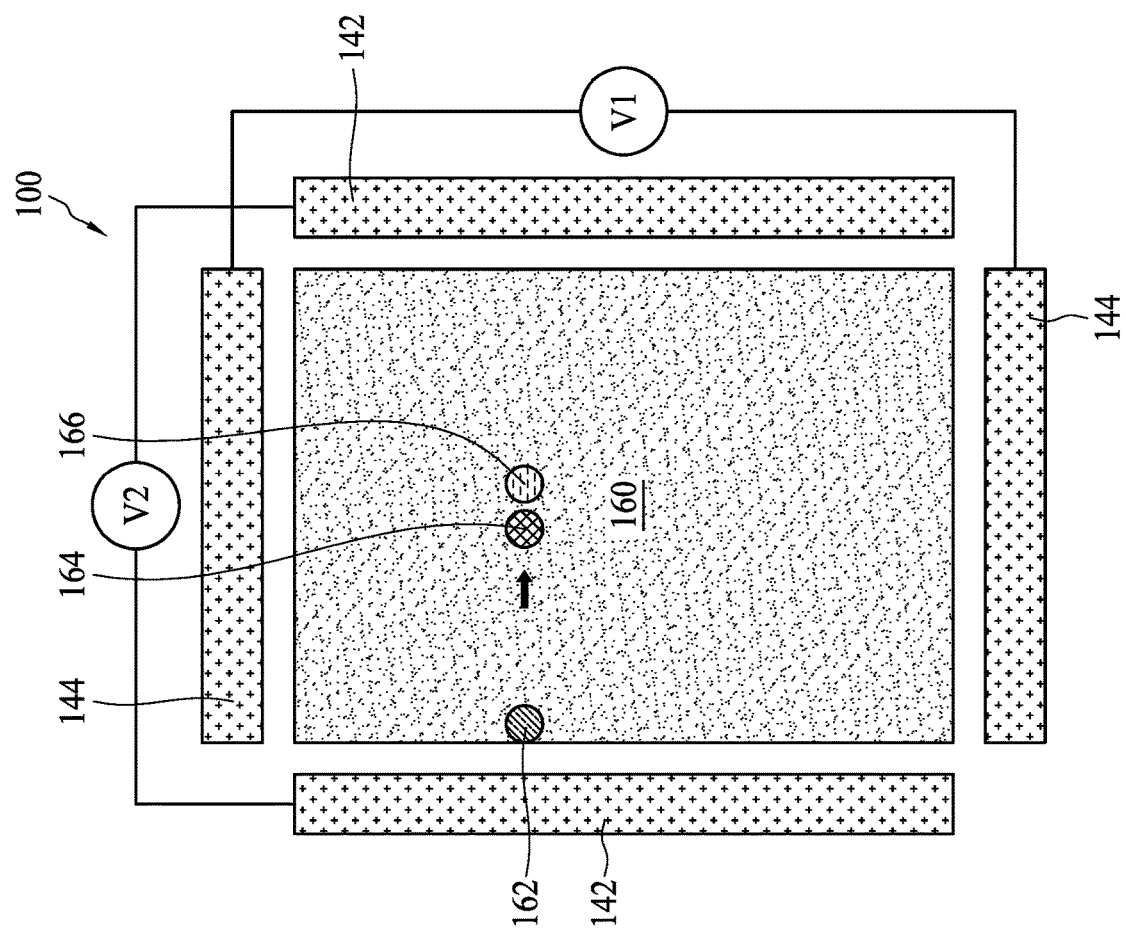
Figure 18:
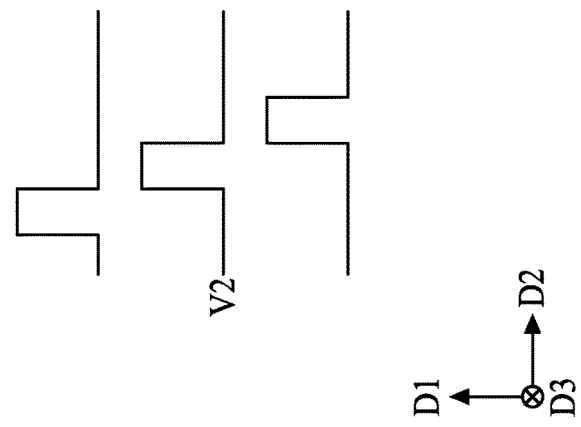

As shown in FIG. 18, at the repeatedly performed operation 34, the second voltage pulse is applied to the pair of first electrodes 142. In some embodiments, the magnitude of the second voltage pulse is not able to break the binding between the matching ligands 162 and the capture reagent. Because the ligands 162 is still bound to the matching capture reagents, the ligand 162 is not moved by the electric field created by the second voltage pulse at operation 34. In contrast to the ligand 162, the ligands 164 and 166, which are not bound to the matching capture reagents, may be moved along the second direction D2 due to the electric field created by the applied second voltage pulse.

Figure 19:
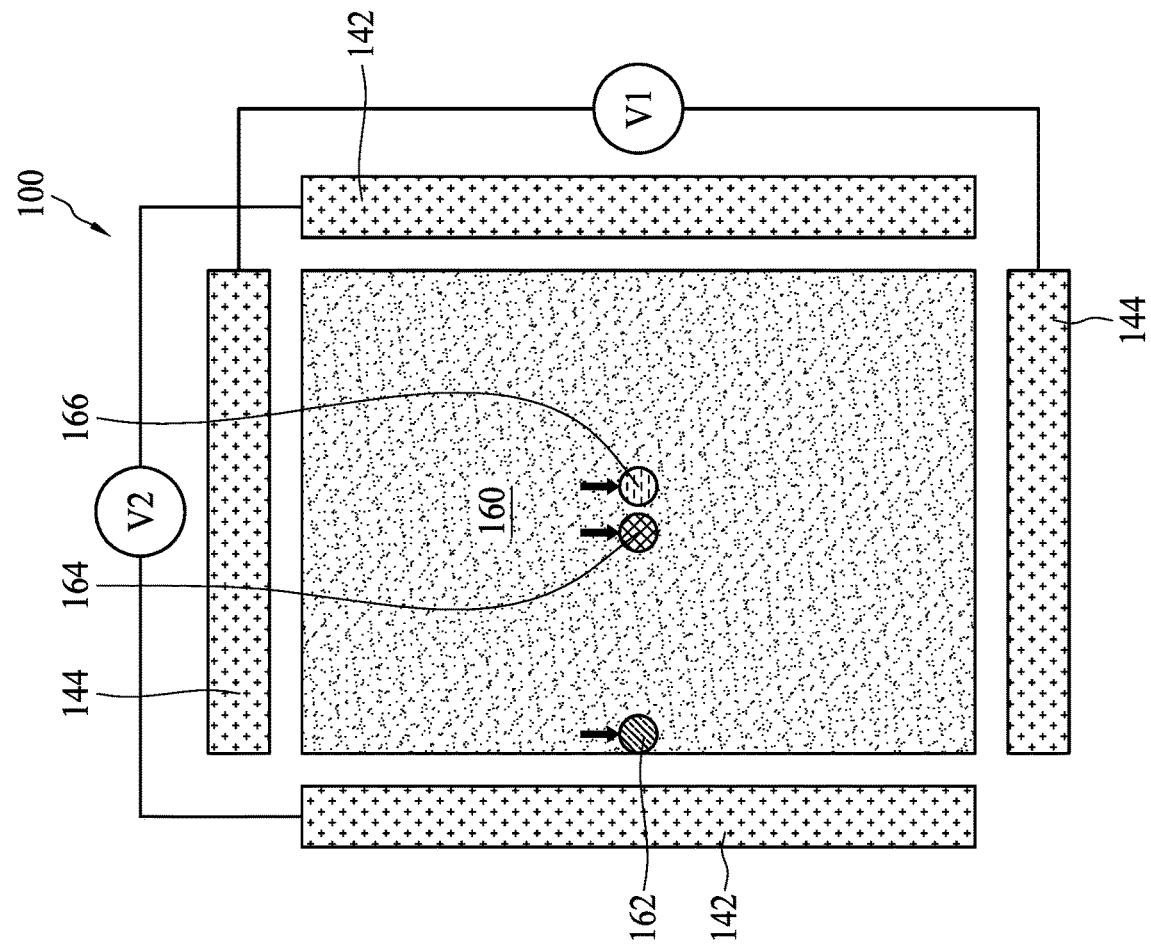
Figure 19:
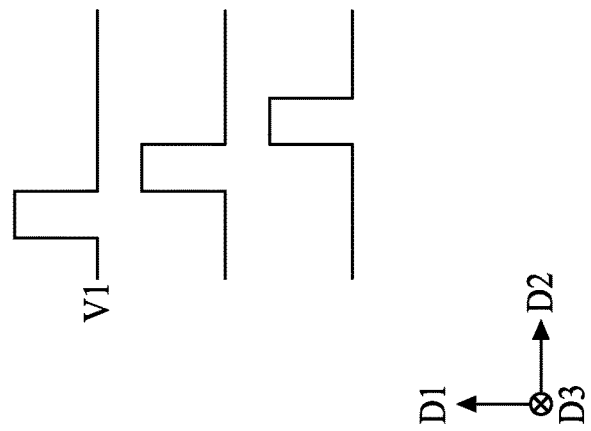

As shown in FIG. 19, at the repeatedly performed operation 33, the first voltage pulse is applied to the pair of second electrodes 144. In some embodiments, the magnitude of the first voltage pulse applied at operation 33 is sufficient to break the binding between the matching ligands 162 and the capture reagent; therefore all the ligands 162, 164 and 166 can be moved along the first direction D1 due to the electric field created by the applied first voltage pulse.

Figure 20:
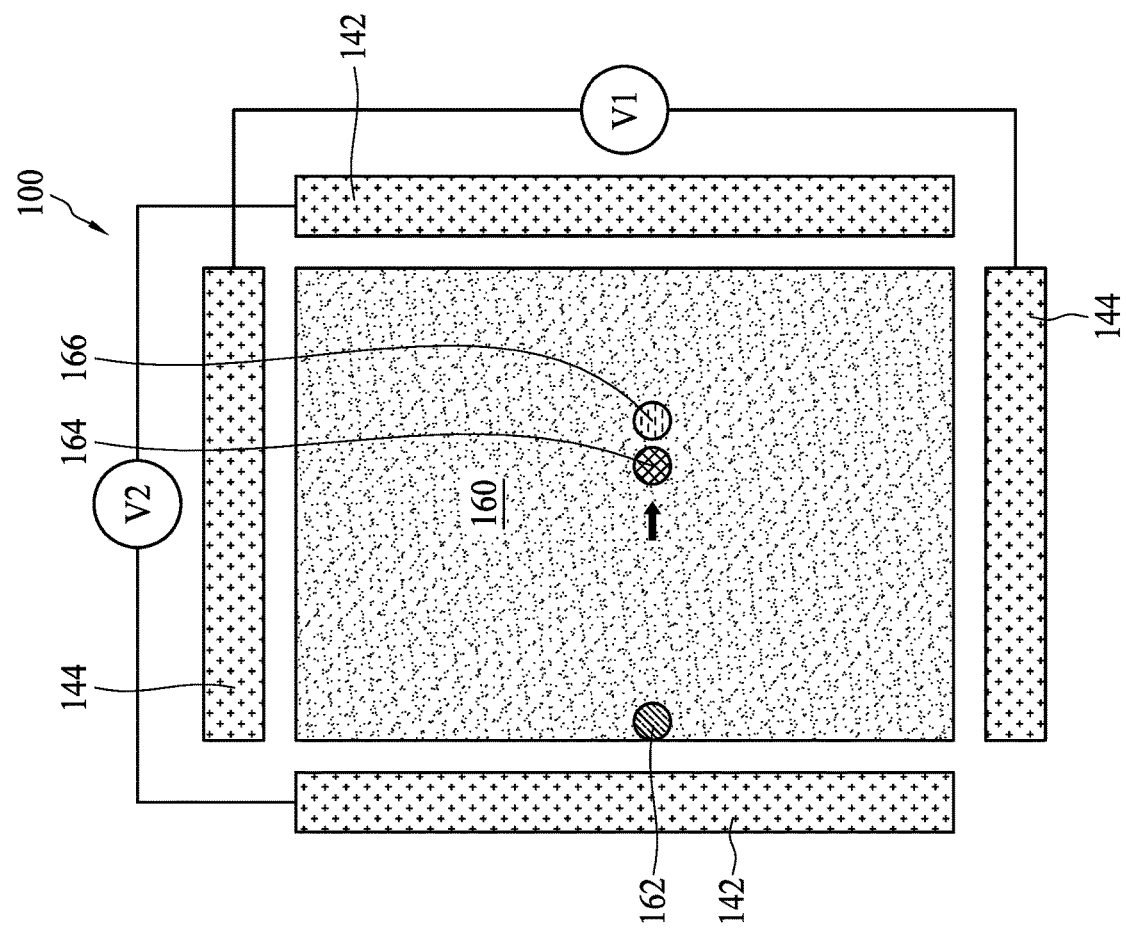
Figure 20:
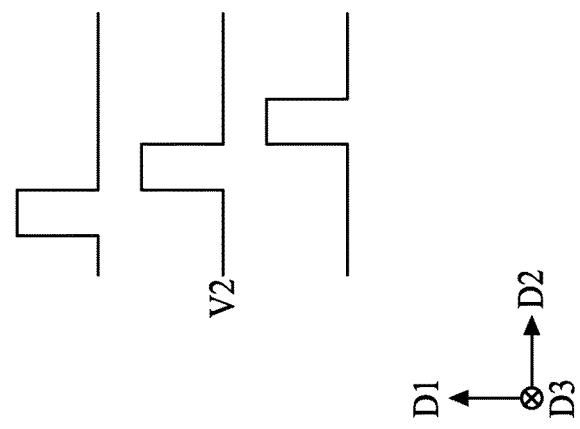

As shown in FIG. 20, at the repeatedly performed operation 34, the second voltage pulse is applied to the pair of first electrodes 142. In some embodiments, the magnitude of the second voltage pulse is not able to break the binding between the matching ligands 162 and the capture reagent. Therefore, the ligand 162 is not moved by the electric field created by the second voltage pulse while the ligands 164 and 166, which are not bound to the matching capture reagents, may be moved along the second direction D2 due to the electric field created by the applied second voltage pulse.

Figure 21:
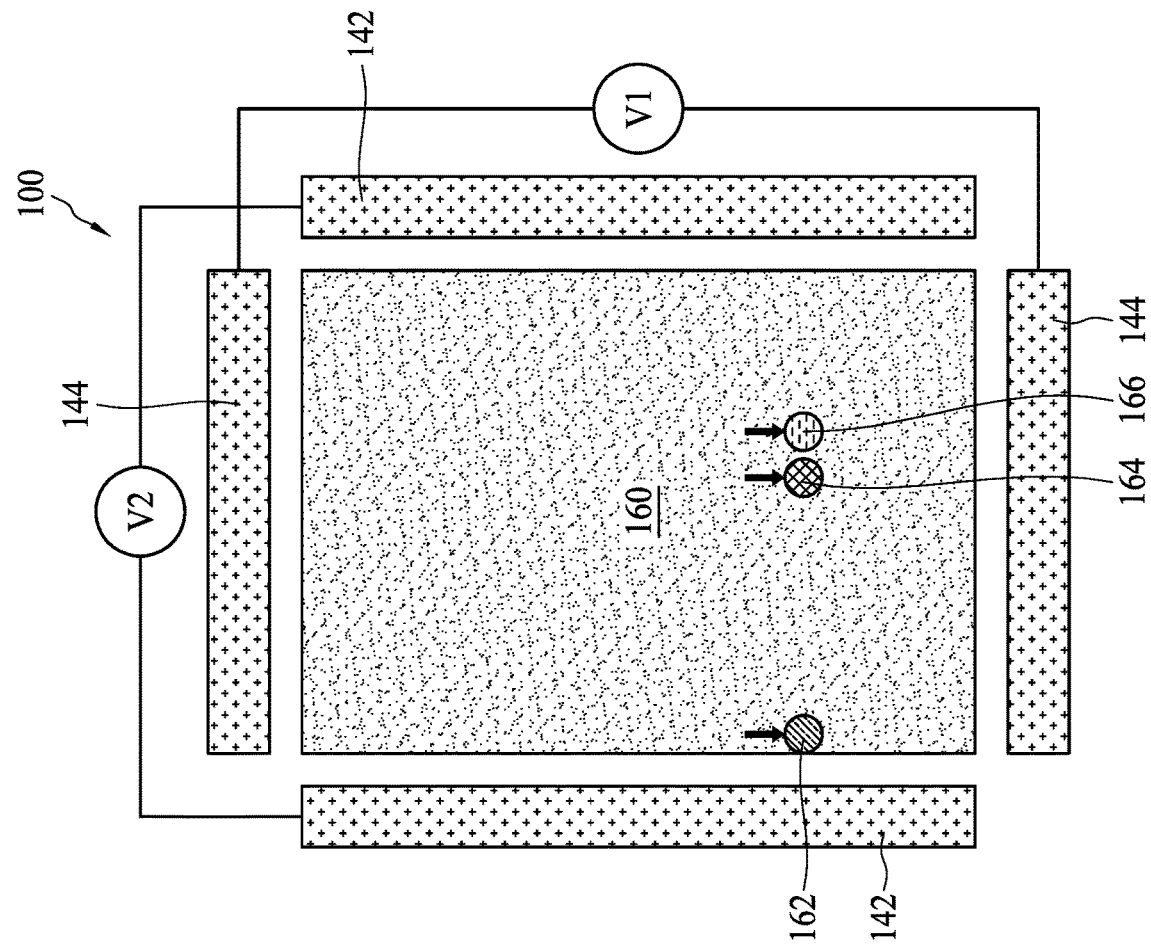
Figure 21:
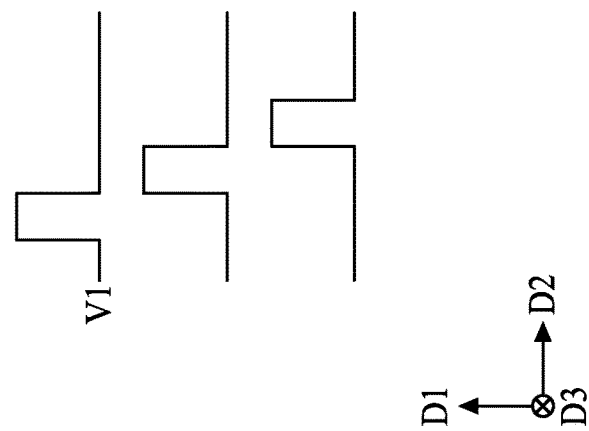

As shown in FIG. 21, at the repeatedly performed operation 33, the first voltage pulse is applied to the pair of second electrodes 144. As mentioned above, the first voltage pulse applied at operation 33 is sufficient to break the binding between the matching ligands 162 and the capture reagent; therefore all the ligands 162, 164 and 166 can be moved along the first direction D1 due to the electric field created by the applied first voltage pulse.

Figure 22:
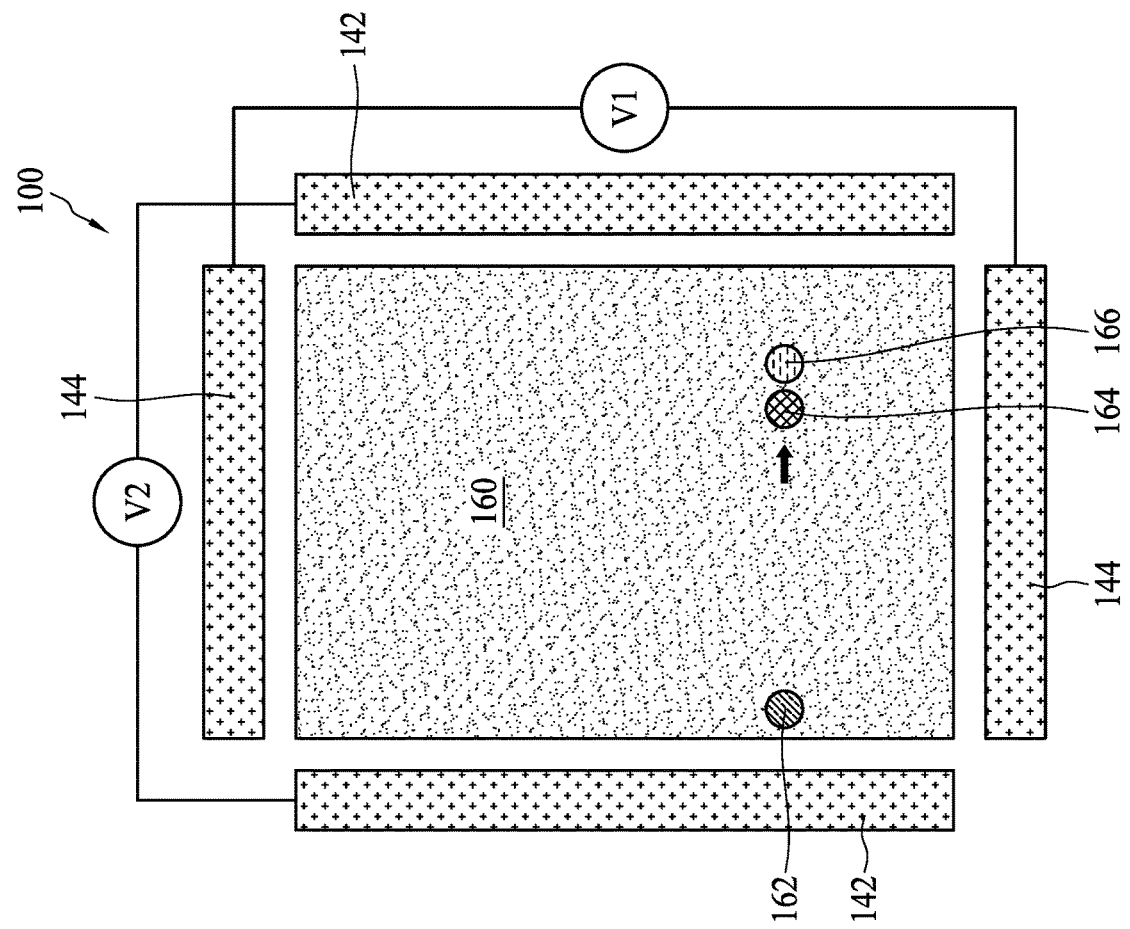
Figure 22:
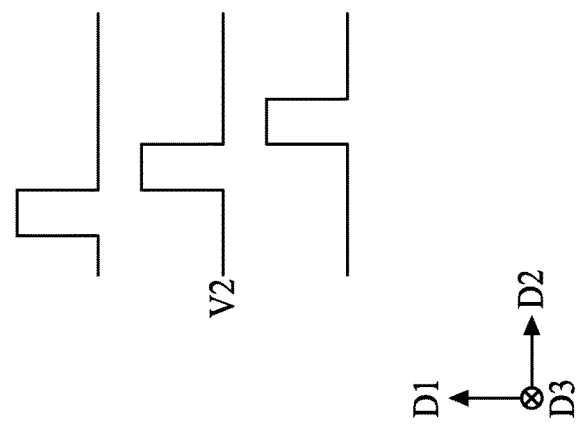

As shown in FIG. 22, at the repeatedly performed operation 34, the second voltage pulse is applied to the pair of first electrodes 142. As mentioned above, the magnitude of the second voltage pulse is not able to break the binding between the matching ligands 162 and the capture reagent. Therefore, the ligand 162 is not moved by the electric field created by the second voltage pulse while the ligands 164 and 166, which are not bound to the matching capture reagents, may be moved along the second direction D2 due to the electric field created by the applied second voltage pulse.

Figure 23:
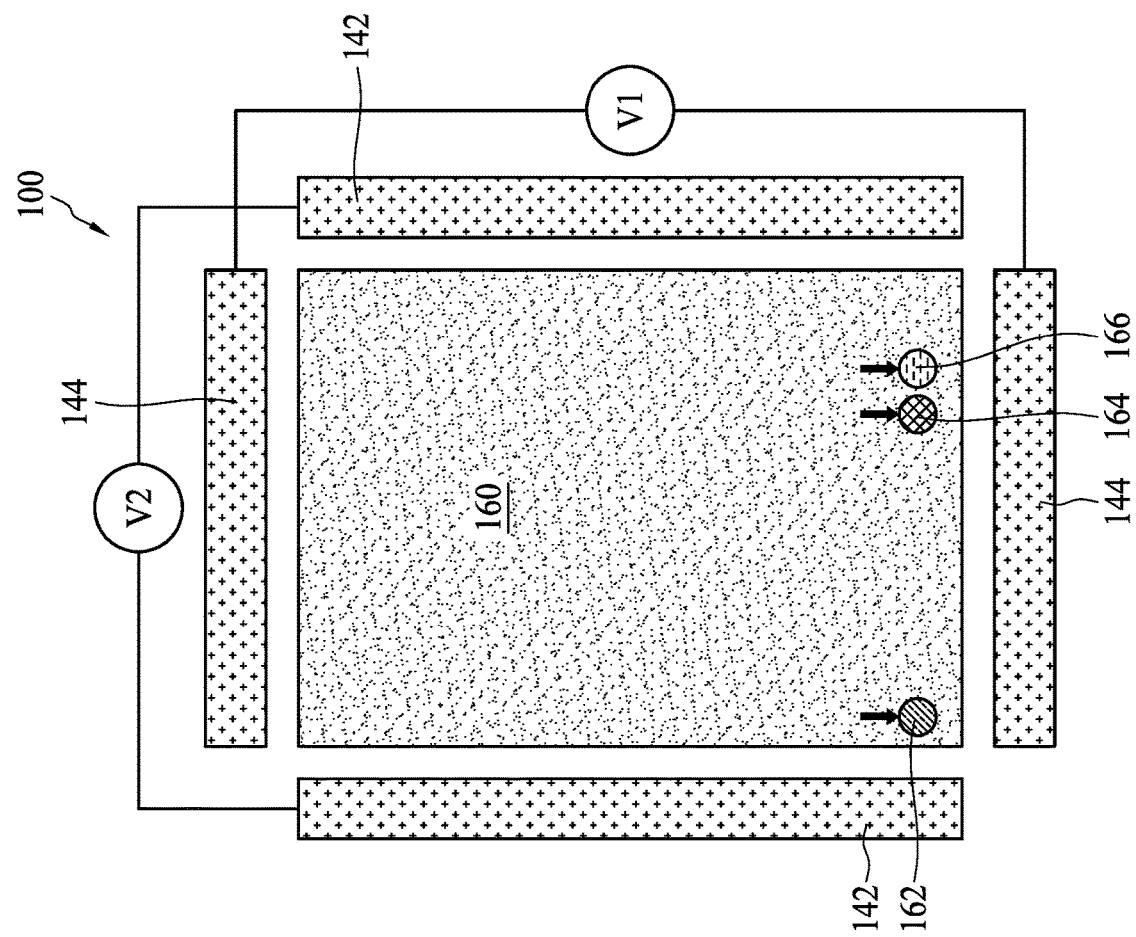
Figure 23:
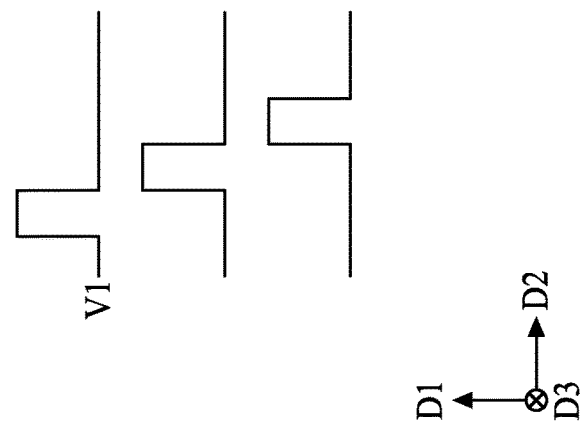

As shown in FIG. 23, at the repeatedly performed operation 33, the first voltage pulse is applied to the pair of second electrodes 144. As mentioned above, the magnitude of the first voltage pulse applied at operation 33 is sufficient to break the binding between the matching ligands 162 and the capture reagent; therefore all the ligands 162, 164 and 166 can be moved along the first direction D1 due to the electric field created by the applied first voltage pulse.

Figure 24:
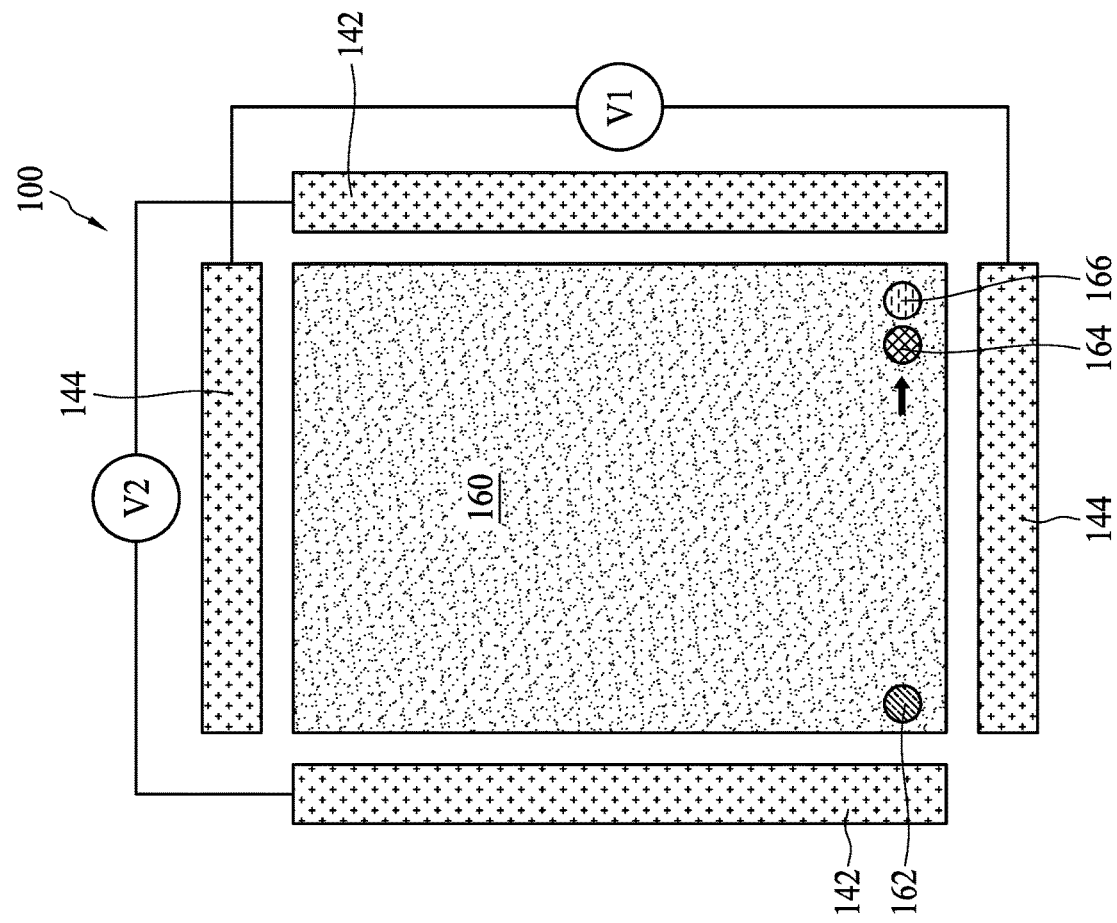
Figure 24:
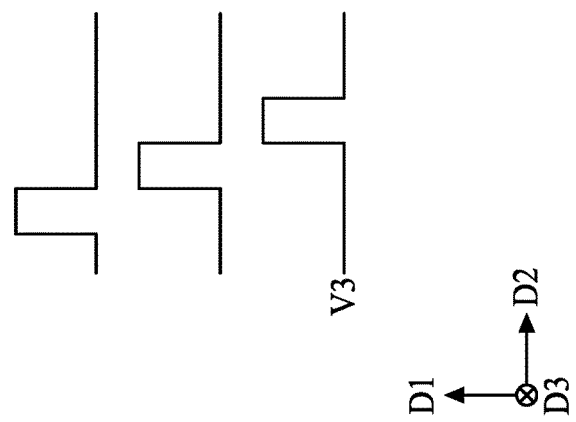

As shown in FIG. 24, at the repeatedly performed operation 34, the second voltage pulse is applied to the pair of first electrodes 142. As mentioned above, the magnitude of the second voltage pulse is not able to break the binding between the matching ligands 162 and the capture reagent. Therefore, the ligand 162 is not moved by the electric field created by the second voltage pulse while the ligands 164 and 166, which are not bound to the matching capture reagents, may be moved along the second direction D2 due to the electric field created by the applied second voltage pulse.

As mentioned above, the magnitude of the first voltage pulse applied at operation 33 is sufficient to move all the ligands 162, 164 and 166, but the magnitude of the second voltage pulse applied at operation 34 is not able to break the binding between the matching ligands 162 and the capture reagent. Therefore, the repeatedly performed operation 33 and operation 34 may cause the matching ligand to 162 move along only one direction (i.e., the first direction D1) while the un-matching ligands 164 and 166 are moved alternately along two directions (i.e., along the first direction D1 then the second direction D2) as shown in FIGS. 18 to 24. In some embodiments, by observing a pattern obtained at the end of the performance of operation 33 and operation 34, presence of some particular ligands can be determined. For example, when the ligand 162 is observed at the leftmost bottom corner as shown in FIG. 24, it can be determined that such analyte 160 includes the particular ligand 162 (i.e., a DNA sequence, an antigen, or a protein).

In some embodiments, operation 35 is performed to apply a third voltage pulse to the third electrode 146. In some embodiments, operation 33, operation 34 and operation 35 can be repeatedly performed.

Figure 25:
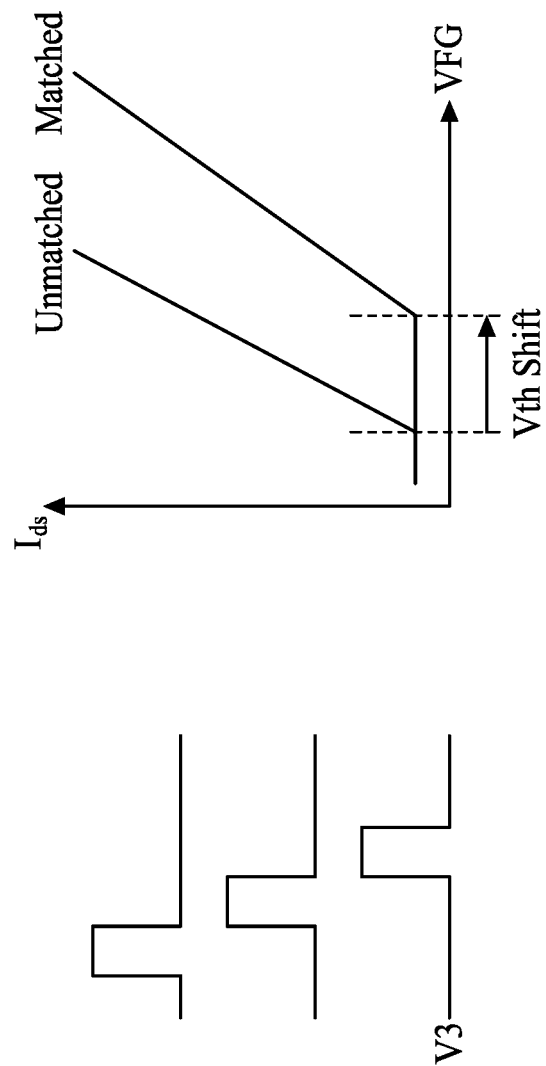
FIG. 25 illustrates a change in threshold voltage for the exemplary FET device of the biosensor based on matched analyte binding.

In some embodiments, the binding of the ligands 162 and the capture reagents increases a negative charge present on the sensing film 130, which is directly above the channel region 118 of the bioFET device 110. FIG. 25 illustrates a shift in the threshold voltage of the bioFET device 110 when matching ligands are bound to the surface of the sensing film 130. Referring to FIGS. 13 and 25, in some embodiments, the third voltage pulse is applied to the third electrode 146 at operation 35 until the biosensor 100 is turned on, and current flows between the drain 116D and the source 116S of the bioFET device 110. When more negative charge is present at the sensing film 130 due to the binding of the ligands 162 and the capture reagent, a higher voltage is required to form the conductive inversion layer within the channel region 118. Thus, a higher voltage may be applied to the third electrode 146 before the bioFET device 110 conducts and Ids current flows.

At operation 36, a threshold voltage difference of the bioFET device 110 is calculated to determine a quantity or a concentration of the ligand 162 in the analyte 160. As mentioned above, when more negative charge is present at the sensing layer due to the binding of the ligand 162 and the capture reagent, a higher voltage is required to form the conductive inversion layer within the channel region 118. Therefore the difference in the threshold voltage can be used to obtain a concentration of the target ligand.

The present disclosure therefore provides a biosensor for integrating target ligand selection, sorting and detection on one chip, and a method for forming the biosensor. The present disclosure further provides a method for operating the biosensor that includes providing alternating electric voltages such that ligands in an analyte may move along two directions or may remain in place due to binding with the capture reagent. Accordingly, ligand selection and sorting can be achieved by the biosensor and the method for using the same. Further, the biosensor and the method for operating the same provide quantitation of the analyte by detecting threshold voltage difference.

According to one embodiment of the present disclosure, a biosensor is provided. The biosensor includes a semiconductor layer having a first surface and a second surface opposite to the first surface, a FET device in the semiconductor layer, an isolation layer over the first surface of the semiconductor layer, a dielectric layer over the isolation layer and the first surface of the semiconductor layer, a pair of first electrodes over the dielectric layer, and a pair of second electrodes over the dielectric layer and separated from the pair of first electrodes. In some embodiments, the isolation layer has a rectangular opening substantially aligned with the FET device. The rectangular opening has pair of first sides and a pair of second sides. An extending direction of the pair of first sides is perpendicular to an extending direction of the pair of second sides. In some embodiments, the pair of first electrodes is disposed over the pair of first sides, and the pair of second electrodes is disposed over the pair of second sides.

According to one embodiment of the present disclosure, a biosensor is provided. The biosensor includes a semiconductor layer having a first surface and a second surface opposite to the first surface, a FET device in the semiconductor layer, an isolation layer over the first surface of the semiconductor layer, an interconnect structure, a dielectric layer over the isolation layer and the first surface of the semiconductor layer, a pair of first electrodes over the dielectric layer, and a pair of second electrodes over the dielectric layer and separated from the pair of first electrodes. The semiconductor layer is disposed between the isolation layer and the interconnect structure. The isolation layer has a rectangular opening substantially aligned with the FET device. The pair of first electrodes is disposed over a pair of first sides of the rectangular opening, and the pair of second electrodes is disposed over a pair of second sides of the rectangular opening.

According to one embodiment of the present disclosure, a biosensor is provided. The biosensor includes a semiconductor layer having a first surface and a second surface opposite to the first surface, a gate structure disposed over the second surface of the semiconductor layer, a source and a drain disposed in the semiconductor layer, a channel region between the source and the drain in the semiconductor layer, an isolation layer over the first surface of the semiconductor layer, an interconnect structure, a dielectric layer over the isolation layer and the first surface of the semiconductor layer, a pair of first electrodes over the dielectric layer, a pair of second electrodes over the dielectric layer and separated from the pair of first electrodes, and a connecting pad coupled to the interconnect structure. The semiconductor layer is disposed between the isolation layer and the interconnect structure. The isolation layer has an opening. The source and the drain extend from the first surface to the second surface of the semiconductor layer. The opening overlaps the channel region and the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor biosensor comprising:
a semiconductor layer having a first surface and a second surface opposite to the first surface;
a field effect transistor (FET) device in the semiconductor layer;
an isolation layer over the first surface of the semiconductor layer, wherein the isolation layer has a rectangular opening substantially aligned with the FET device;
a dielectric layer over the isolation layer and the first surface of the semiconductor layer;
a pair of first electrodes over the dielectric layer; and
a pair of second electrodes over the dielectric layer and separated from the pair of first electrodes,
wherein the rectangular opening has a pair of first sides and a pair of second sides, an extending direction of the pair of second sides is perpendicular to an extending direction of the pair of first sides, the pair of first electrodes are disposed over the pair of first sides, and the pair of second electrodes are disposed over the pair of second sides,
wherein a length of the first electrode is substantially equal to a length of the first side, and a length of the second electrode is substantially equal to a length of the second side.

2. The biosensor of claim 1, wherein the FET device comprises a gate structure disposed over the second surface of the semiconductor structure, a source and a drain disposed in the semiconductor layer and a channel region between the source and the drain in the semiconductor layer, wherein the source and the drain extend from the first surface to the second surface of the semiconductor layer, and the rectangular opening substantially overlaps the channel region.

3. The biosensor of claim 1, wherein the pair of first electrodes are electrically connected to a first voltage source, and the pair of second electrodes are electrically connected to a second voltage source.

4. The biosensor of claim 3, wherein the first voltage source provides a voltage to the pair of first electrodes, the second voltage source provides a voltage to the pair of second electrodes, and the voltage provided to the pair of second electrodes is greater than the voltage provided to the pair of first electrodes.

5. The biosensor of claim 1, further comprising a third electrode disposed over the rectangular opening and separated from the first surface of the semiconductor layer.

6. The biosensor of claim 1, further comprising:
an interconnect structure disposed over the second surface of the semiconductor layer; and
a connecting pad coupled to the interconnect structure.

7. The biosensor of claim 6, wherein a thickness of the first electrode, a thickness of the second electrode, and a thickness of the connecting pad are substantially the same.

8. A semiconductor biosensor comprising:
a semiconductor layer having a first surface and a second surface opposite to the first surface;
a field effect transistor (FET) device in the semiconductor layer;
an isolation layer over the first surface of the semiconductor layer, wherein the isolation layer has a rectangular opening substantially aligned with the FET device;
an interconnect structure, wherein the semiconductor layer is disposed between the isolation layer and the interconnect structure;
a dielectric layer over the isolation layer and in contact with the first surface of the semiconductor layer through the rectangular opening;
a pair of first electrodes over the dielectric layer; and
a pair of second electrodes over the dielectric layer and separated from the pair of first electrodes,
wherein the pair of first electrodes is disposed over a pair of first sides of the rectangular opening, and the pair of second electrodes is disposed over a pair of second sides of the rectangular opening,
wherein the pair of first electrodes are electrically connected to a first voltage source, and the pair of second electrodes are electrically connected to a second voltage source.

9. The biosensor of claim 8, wherein a length of the first electrode is substantially equal to a length of the first side, and a length of the second electrode is substantially equal to a length of the second side.

10. The biosensor of claim 8, wherein the FET device comprises a gate structure disposed over the second surface of the semiconductor structure, a source and a drain disposed in the semiconductor layer and a channel region between the source and the drain in the semiconductor layer, wherein the source and the drain extend from the first surface to the second surface of the semiconductor layer, and the rectangular opening substantially overlaps the channel region.

11. The biosensor of claim 8, wherein the first voltage source provides a voltage to the pair of first electrodes, the second voltage source provides a voltage to the pair of second electrodes, and the voltage provided to the pair of second electrodes is greater than the voltage provided to the pair of first electrodes.

12. The biosensor of claim 8, further comprising a third electrode disposed over the rectangular opening and separated from the first surface of the semiconductor layer.

13. The biosensor of claim 8, further comprising a connecting pad coupled to the interconnect structure.

14. The biosensor of claim 13, wherein a thickness of the first electrode, a thickness of the second electrode, and a thickness of the connecting pad are substantially the same.

15. A semiconductor biosensor comprising:
a semiconductor layer having a first surface and a second surface opposite to the first surface;
a gate structure disposed over the second surface of the semiconductor layer;
a source and a drain disposed in the semiconductor layer and a channel region between the source and the drain in the semiconductor layer;
an isolation layer over the first surface of the semiconductor layer, wherein the isolation layer has an opening;

an interconnect structure, wherein the semiconductor layer is disposed between the isolation layer and the interconnect structure;
a dielectric layer over the isolation layer and in contact with the first surface of the semiconductor layer through the opening;
a pair of first electrodes over the dielectric layer;
a pair of second electrodes over the dielectric layer and separated from the pair of first electrodes; and
a connecting pad coupled to the interconnect structure,
wherein the source and the drain extend from the first surface to the second surface of the semiconductor layer, and the opening overlaps the channel region and the gate structure.

16. The biosensor of claim 15, wherein the pair of first electrodes are electrically connected to a first voltage source, and the pair of second electrodes are electrically connected to a second voltage source.

17. The biosensor of claim 15, wherein the opening has a pair of first sides and a pair of second sides, an extending direction of the pair of second sides is perpendicular to an extending direction of the pair of first sides, the pair of first electrodes are disposed over the pair of first sides, and the pair of second electrodes are disposed over the pair of second sides.

18. The biosensor of claim 15, wherein a thickness of the first electrode, a thickness of the second electrode, and a thickness of the connecting pad are substantially the same.

19. The biosensor of claim 15, wherein a top surface of the connecting pad is lower than the first surface of the semiconductor layer.

20. The biosensor of claim 15, wherein the connecting pad is coupled to a conductor in the interconnect structure.

* * * * *